(12) United States Patent
Kandori et al.

(10) Patent No.: US 11,770,102 B2
(45) Date of Patent: Sep. 26, 2023

(54) OSCILLATOR AND IMAGING DEVICE

(71) Applicant: CANON KABUSHIKI KAISHA, Tokyo (JP)

(72) Inventors: Atsushi Kandori, Ebina (JP); Noriyuki Kaifu, Hachioji (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/894,244

(22) Filed: Aug. 24, 2022

(65) Prior Publication Data

US 2022/0407457 A1 Dec. 22, 2022

Related U.S. Application Data

(63) Continuation of application No. 17/001,821, filed on Aug. 25, 2020, now Pat. No. 11,451,193.

(30) Foreign Application Priority Data

Aug. 26, 2019 (JP) .................................. 2019-153699

(51) Int. Cl.
*H03B 5/12* (2006.01)
*H03B 7/08* (2006.01)

(52) U.S. Cl.
CPC ............... *H03B 5/129* (2013.01); *H03B 7/08* (2013.01)

(58) Field of Classification Search
CPC .................................. H03B 5/129; H03B 7/08
See application file for complete search history.

(56) References Cited

U.S. PATENT DOCUMENTS

| 3,114,882 | A | * | 12/1963 | Hofstein | ................ | H03D 11/04 |
|---|---|---|---|---|---|---|
| | | | | | | 327/47 |
| 6,288,615 | B1 | | 9/2001 | Kobayashi | | |
| 7,598,817 | B2 | | 10/2009 | Numata et al. | | |
| 8,176,780 | B2 | | 5/2012 | Takagi et al. | | |
| 8,339,014 | B2 | | 12/2012 | Kandori et al. | | |
| 8,393,211 | B2 | | 3/2013 | Kandori et al. | | |
| 9,258,650 | B2 | | 2/2016 | Kandori | | |
| 11,283,406 | B2 | | 3/2022 | Kandori et al. | | |
| 11,451,193 | B2 | * | 9/2022 | Kandori | ................. | H03B 5/129 |
| 2007/0215808 | A1 | | 9/2007 | Sekiguchi et al. | | |
| 2007/0279136 | A1 | | 12/2007 | Koyama et al. | | |
| 2009/0079648 | A1 | | 3/2009 | Matsuo et al. | | |
| 2012/0105161 | A1 | | 5/2012 | Ouchi et al. | | |

(Continued)

FOREIGN PATENT DOCUMENTS

| JP | 2007-248382 A | 9/2007 |
|---|---|---|
| JP | 2008-010811 A | 1/2008 |

(Continued)

OTHER PUBLICATIONS

Aug. 1, 2023 Office Action in Japanese Patent Application No. 2019-153699 (with English translation).

(Continued)

*Primary Examiner* — Jeffrey M Shin
(74) *Attorney, Agent, or Firm* — Venable LLP

(57) ABSTRACT

An oscillator is comprising a plurality of resonators and a voltage bias circuit that applies voltages to the plurality of resonators. Each of the plurality of resonators has a negative resistance element. In the oscillator, the plurality of resonators are connected in parallel to the voltage bias circuit respectively via separate inductors.

28 Claims, 20 Drawing Sheets

(56) References Cited

U.S. PATENT DOCUMENTS

| | | |
|---|---|---|
| 2012/0112844 A1* | 5/2012 | Sekiguchi ............ H03B 7/08 |
| | | 331/115 |
| 2012/0119838 A1 | 5/2012 | Koyama et al. |
| 2013/0328635 A1* | 12/2013 | Sekiguchi ............ H03B 7/14 |
| | | 331/105 |
| 2019/0259791 A1 | 8/2019 | Itsuji et al. |
| 2020/0266762 A1 | 8/2020 | Kandori et al. |
| 2021/0067095 A1 | 3/2021 | Kandori et al. |

FOREIGN PATENT DOCUMENTS

| | | |
|---|---|---|
| JP | 2011-061274 A | 3/2011 |
| JP | 2011-061276 A | 3/2011 |
| JP | 2015-008397 A | 1/2015 |
| JP | 2018-087725 A | 6/2018 |
| WO | 2007/091470 A1 | 7/2009 |

OTHER PUBLICATIONS

Jenshan Lin et al., Two-Dimensional Quasi-Optical Power-Combining Arrays Using Strongly Coupled Oscillators, 42 IEEE Transactions on Microwave Theory and Techniques 734 (1994).

* cited by examiner

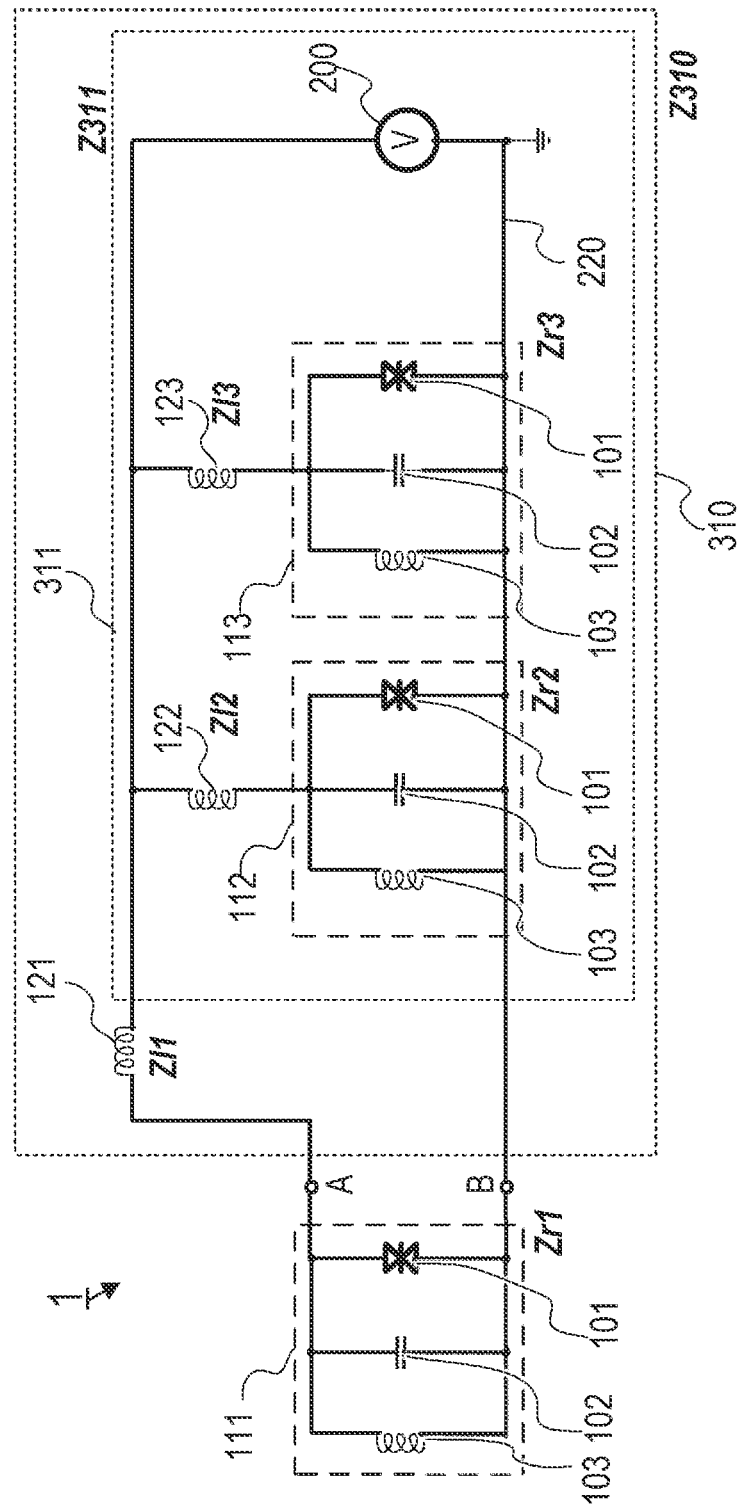

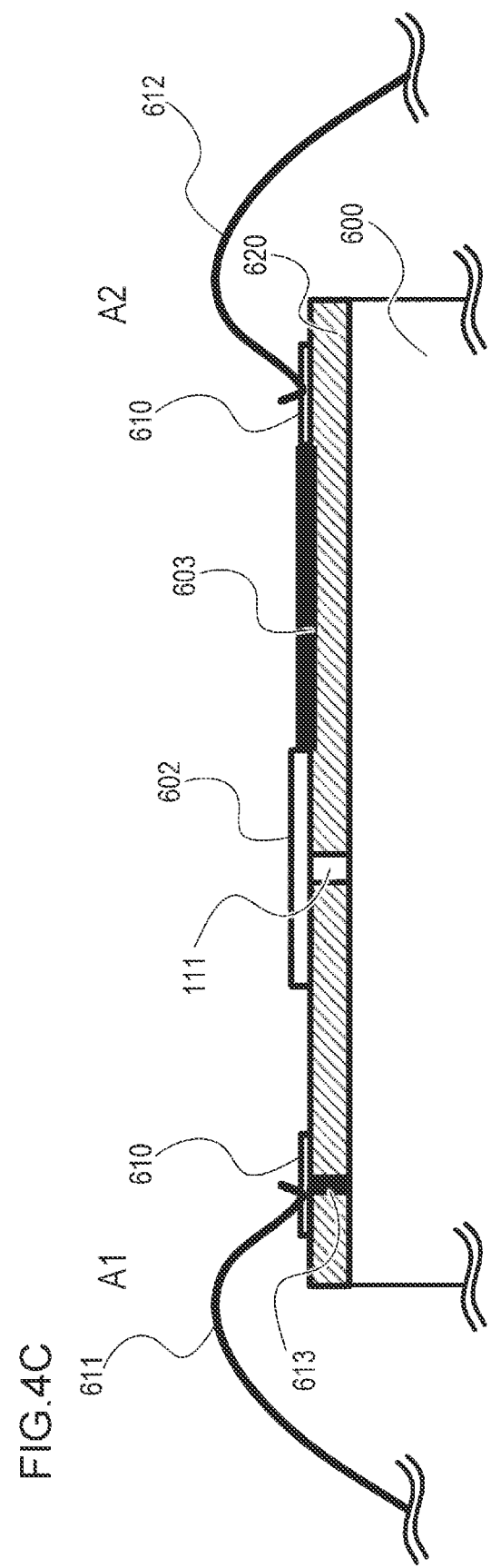

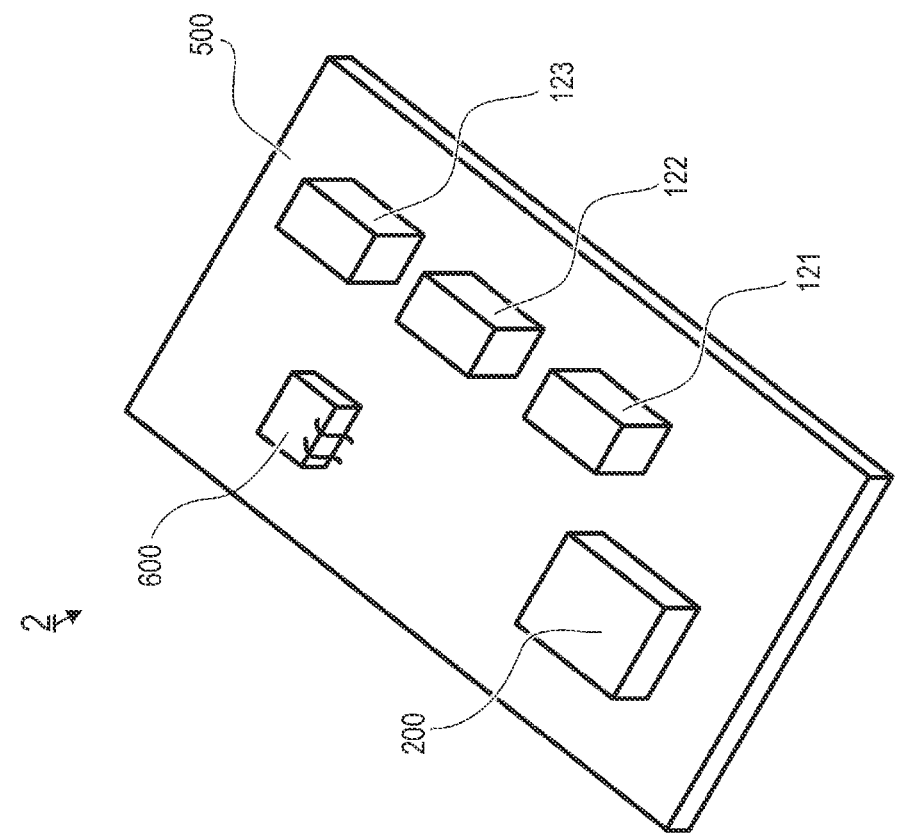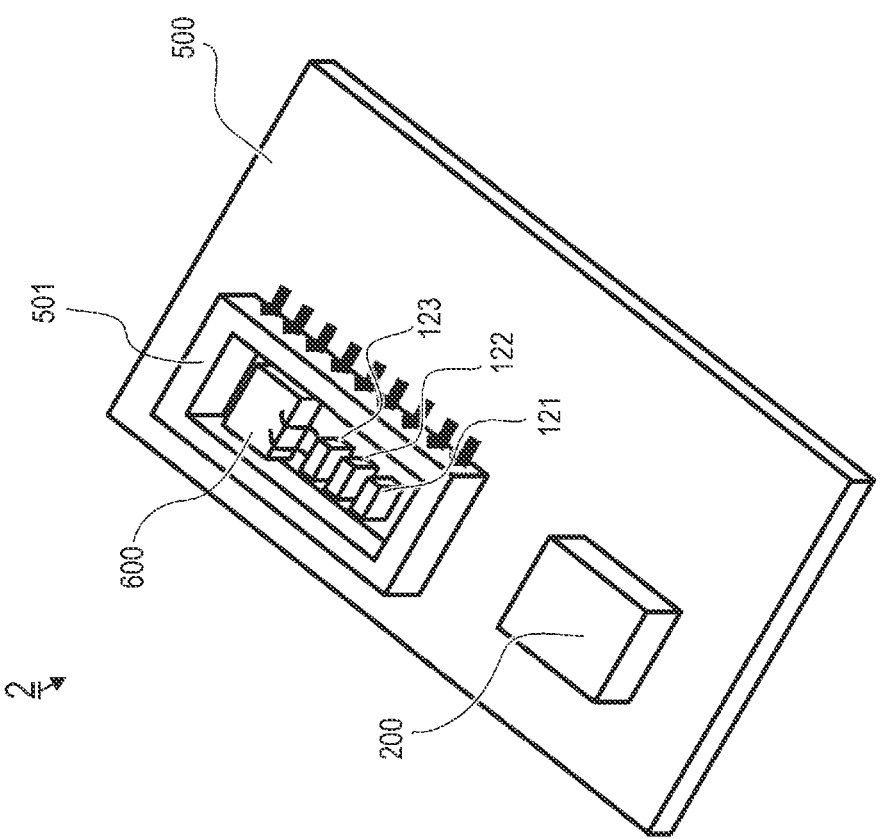

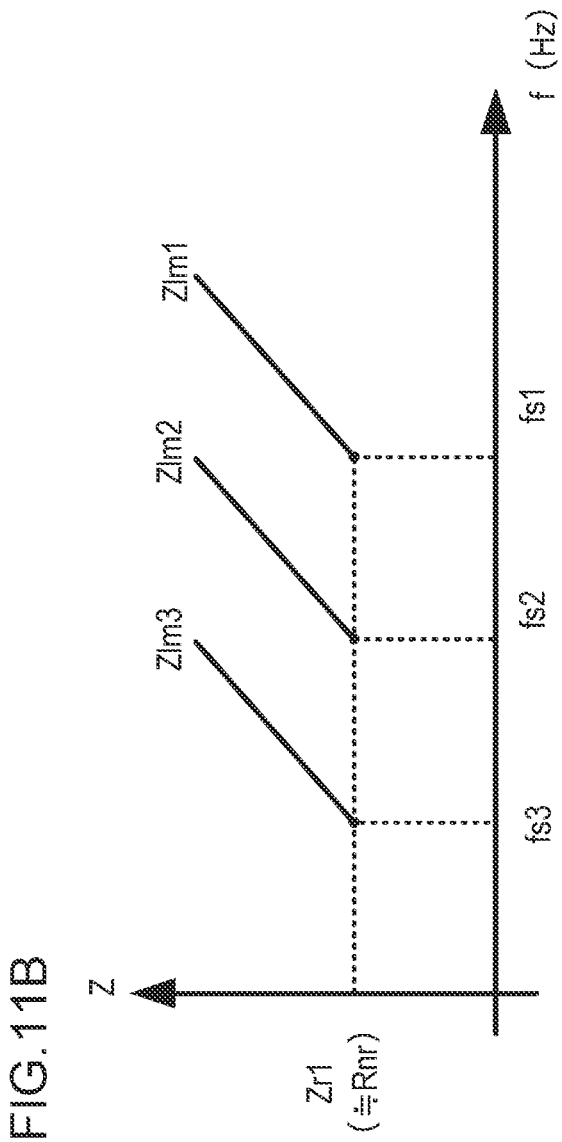

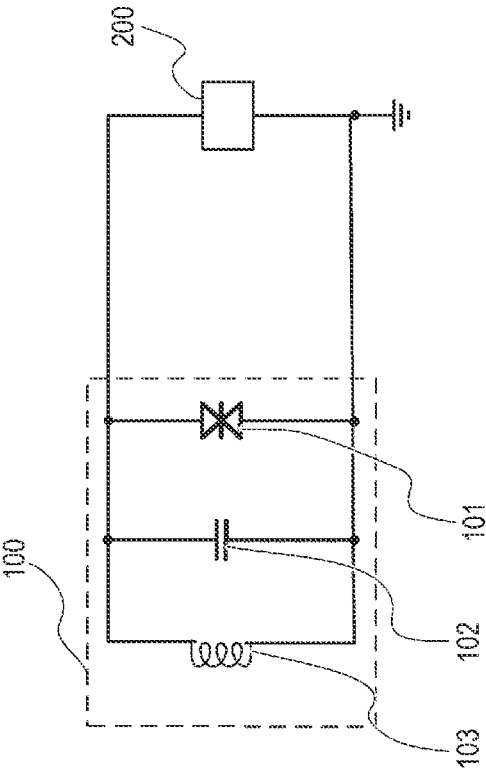
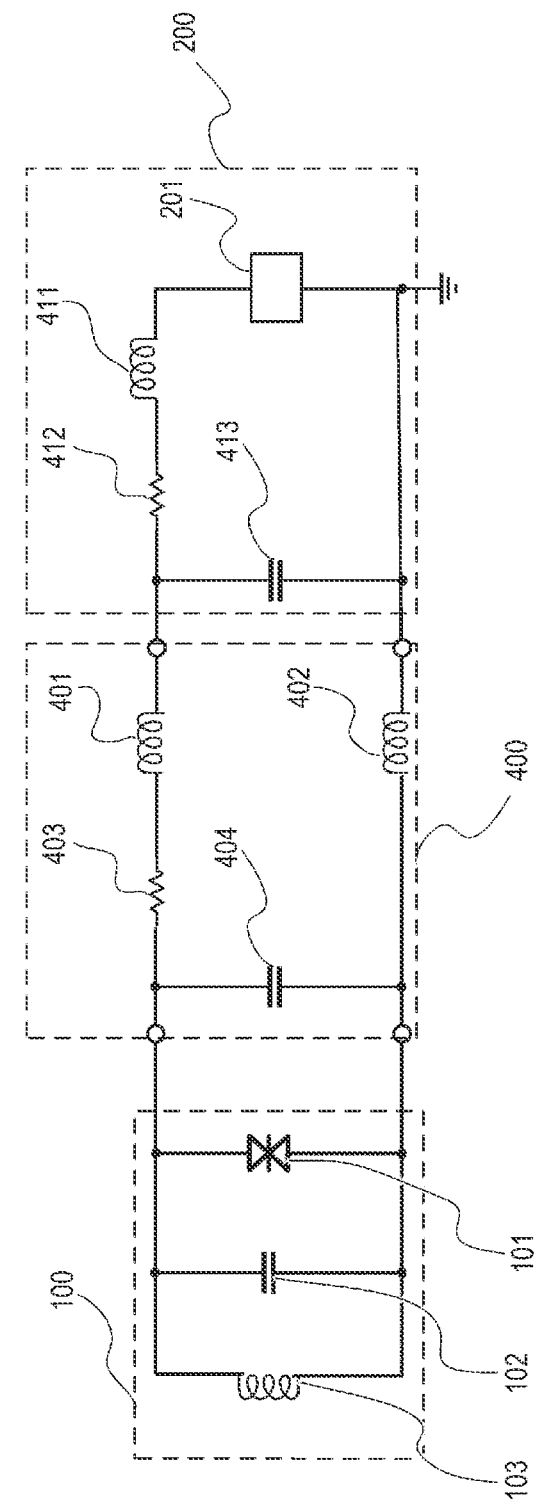
FIG. 14A
FIG. 14B

OSCILLATOR AND IMAGING DEVICE

BACKGROUND OF THE INVENTION

Field of the Invention

The present invention relates to an oscillator and an imaging device.

Description of the Related Art

An oscillation circuit such as that disclosed in Japanese Patent Application Publication No. 2011-61276 is available as a small oscillator for generating terahertz waves, which are electromagnetic waves (radio waves) in any frequency band from 30 GHz to 30 THz. This oscillation circuit is configured to include a negative resistance element such as a resonant tunneling diode (RTD). In this configuration, as shown in FIG. 14A, an oscillation circuit 100 includes a negative resistance element 101, a capacitor 102, and an inductor 103. Here, a voltage bias circuit 200 is connected to the oscillation circuit 100 so that the negative resistance element 101 applies a voltage value having a negative resistance characteristic.

In a case where an oscillator is used as a light of a terahertz camera or the like, a plurality of oscillation circuits (resonators) are provided in an array so that terahertz waves are emitted evenly over a wide region. For this purpose, a configuration in which the plurality of oscillation circuits are driven by the same voltage bias circuit is adopted.

However, when the technology described in Japanese Patent Application Publication No. 2011-61276 is used to apply voltages are applied to a plurality of oscillation circuits using a single voltage bias circuit, electromagnetic waves of a different frequency to the desired frequency may be generated due to inappropriate oscillation by the oscillation circuits (the resonators).

SUMMARY OF THE INVENTION

An object of the disclosure of this technology is to enable an oscillator configured such that voltages are applied to a plurality of resonators by a voltage bias circuit to oscillate appropriately.

An aspect of the disclosure of this technology is:

an oscillator comprising:

a plurality of resonators, each having a negative resistance element; and a voltage bias circuit that applies voltages to the plurality of resonators, wherein the plurality of resonators are connected in parallel to the voltage bias circuit respectively via separate inductors.

Further features of the present invention will become apparent from the following description of exemplary embodiments with reference to the attached drawings.

BRIEF DESCRIPTION OF THE DRAWINGS

FIG. 3C is a circuit diagram illustrating the oscillator according to the first embodiment;

FIGS. 4A to 4C are views showing an oscillator according to a second embodiment;

FIGS. 5A and 5B are views showing the oscillator according to the second embodiment;

FIGS. 11A and 11B are views illustrating the oscillator according to the sixth embodiment;

FIGS. 14A and 14B are views showing a conventional oscillator.

DESCRIPTION OF THE EMBODIMENTS

Embodiments of the present invention will be described below using the figures. Note, however, that the present invention is not limited to these embodiments and may be subjected to various amendments and modifications within the scope of the spirit thereof.

First Embodiment

Figure 1:
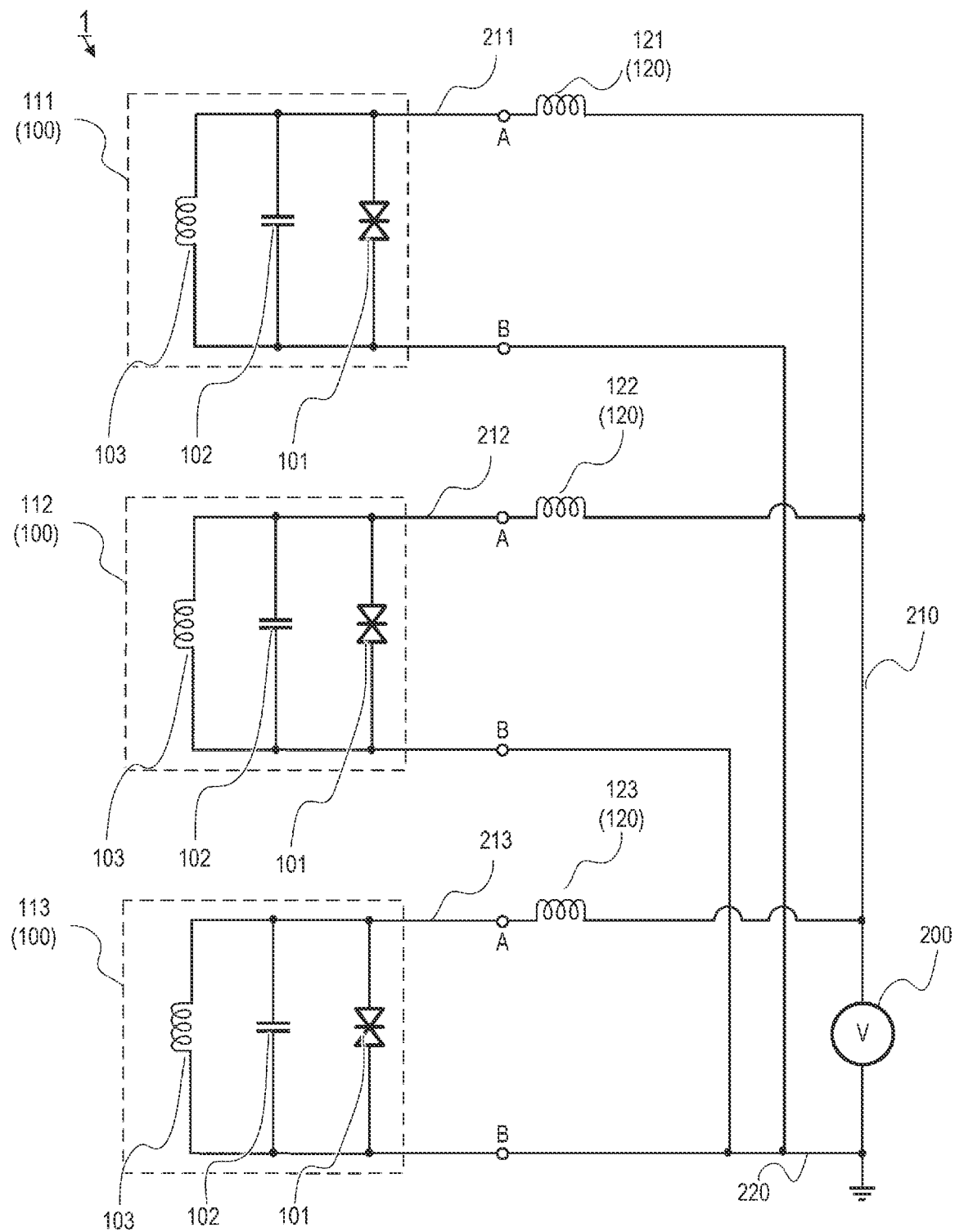
FIG. 1 is a circuit diagram of an oscillator according to a first embodiment.

First, an oscillator 1 according to a first embodiment will be described using FIG. 1. FIG. 1 is a pattern diagram (a circuit diagram) illustrating the oscillator 1. The oscillator 1 includes three oscillation circuits 100, three inductors 120, a voltage bias circuit 200, wiring 210, wiring 211 to 213, and shared wiring 220. The three oscillation circuits 100 have identical configurations and are constituted by an oscillation circuit 111, an oscillation circuit 112, and an oscillation circuit 113. Further, the oscillation circuits 111 to 113 are respectively connected to the inductors 120. The inductors 120 to which the oscillation circuits 111 to 113 are respectively connected are constituted by inductors 121 to 123. The wiring 210 and the shared wiring 220 are connected to the voltage bias circuit 200. The oscillation circuits 111 to 113 are respectively connected to the wiring 210 by the wiring 211 to 213.

In this embodiment, the plurality of oscillation circuits 100 are connected to the single voltage bias circuit 200. More specifically, the three oscillation circuits 100, namely the oscillation circuits 111, 112, and 113, are connected in parallel to the voltage bias circuit 200. Note, however, that the number of oscillation circuits is not limited to three, and as long as the oscillation circuits can be driven by the voltage bias circuit 200, the number thereof may be set as desired. Further, although a configuration in which the oscillator 1 is constituted by a single group including the voltage bias circuit 200 and the plurality of oscillation circuits 111 to 113 is described here, this embodiment is not limited to this configuration and can also be realized by an oscillator having a plurality of groups, each of which includes the voltage bias circuit 200 and a plurality of oscillation circuits.

Oscillation Circuit

The oscillation circuit 100 will be described below. As noted above, the oscillation circuit 111, the oscillation circuit 112, and the oscillation circuit 113 constitute the oscillation circuits 100 and have identical configurations. Each oscillation circuit 100 is a resonator (a terahertz oscillation circuit) including a negative resistance element 101, a capacitor 102, and an inductor 103. The oscillation circuit 100 generates terahertz waves by performing oscillation between 30 GHz and 30 THz when an operation voltage Vop is applied thereto by the voltage bias circuit 200. Note that hereafter, oscillation at a desired frequency ft determined principally by the design parameters of the oscillation circuit will be referred to as "terahertz oscillation".

A voltage-controlled negative resistor can be used as the negative resistance element 101. More specifically, a current injection-type RTD (Resonant Tunneling Diode) can be used as the negative resistance element 101. In so doing, the oscillation circuit 100 can be capable of oscillating at a terahertz frequency. The resonant tunneling diode (RTD hereafter) is constituted by a quantum well made of GaAs or InGaAs/InAlAs.

Figure 2A:
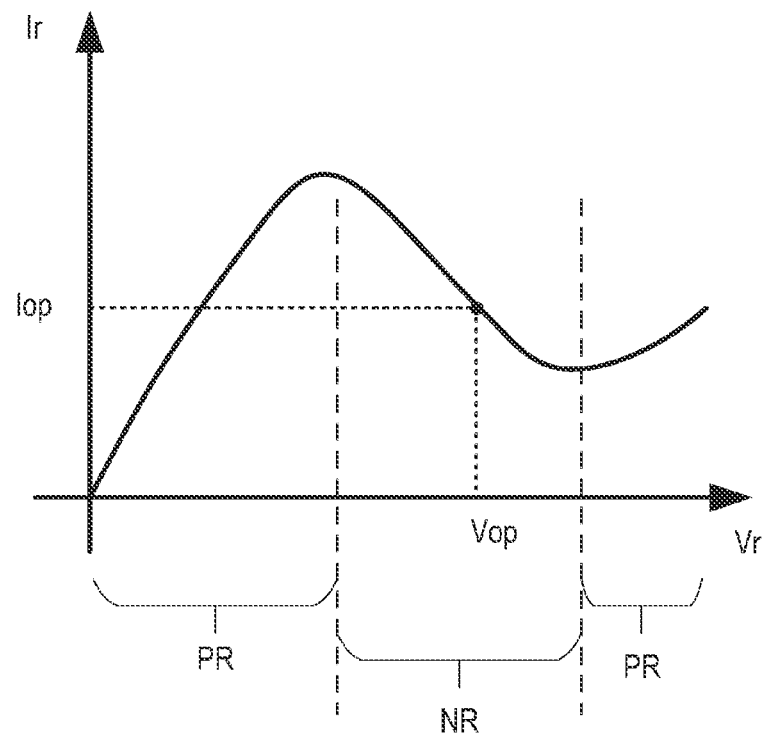
FIGS. 2A and 2B are graphs showing a voltage-current characteristic of a negative resistance element according to the first embodiment.

FIG. 2A is a pattern diagram illustrating a current-voltage characteristic of the negative resistance element 101. The horizontal axis shows a voltage Vr applied to the negative resistance element 101, and the vertical axis shows a current Ir flowing through the negative resistance element 101. The voltage-current characteristic of the voltage applied between the two terminals (the anode and the cathode) of the negative resistance element 101 and the current flowing therethrough can be divided into a region PR in which the current value increases relative to voltage increases, and a region NR in which the current value decreases relative to voltage increases. The region NR in which the current value decreases relative to voltage increases is a region having a negative resistance characteristic. Hereafter, the region NR and the region PR will be referred to respectively as the "negative resistance region" and the "resistance region". This embodiment is designed so that when a voltage value (the operation voltage Vop) in the negative resistance region NR is applied between the two terminals of the negative resistance element 101, oscillation is performed at a desired terahertz frequency ft between the negative resistance element 101 and the capacitor 102 and inductor 103. When the operation voltage Vop varies, the oscillation conditions (the frequency and the size of the output) and so on also vary, and therefore a constant voltage value must be applied to the negative resistance element 101. Note that in order to improve the stability of oscillation, the applied voltage value is preferably a value near the center of the voltage range of the negative resistance region NR. This embodiment is not limited thereto, however, and as long as the applied voltage is within the negative resistance region NR, terahertz oscillation can be performed even when a different voltage is applied to the negative resistance element 101.

Further, the current value that flows through the negative resistance element 101 while the operation voltage Vop is applied is set as Top. Here, as regards a specific value of the operation voltage Vop, the value changes according to the parameters of the negative resistance element 101 but is often within a range of approximately 0.5 to 1.5 volts (V). Meanwhile, as regards a specific value of the current value Top, similarly, the value changes according to the parameters of the negative resistance element 101 but is often within a range of approximately 20 to 150 milliamperes (mA). Note, however, that this embodiment is not limited to the aforesaid voltage value and current value ranges of the operation voltage Vop and the current value Top, and different ranges to those described above may be used in a similar manner.

Figure 2B:
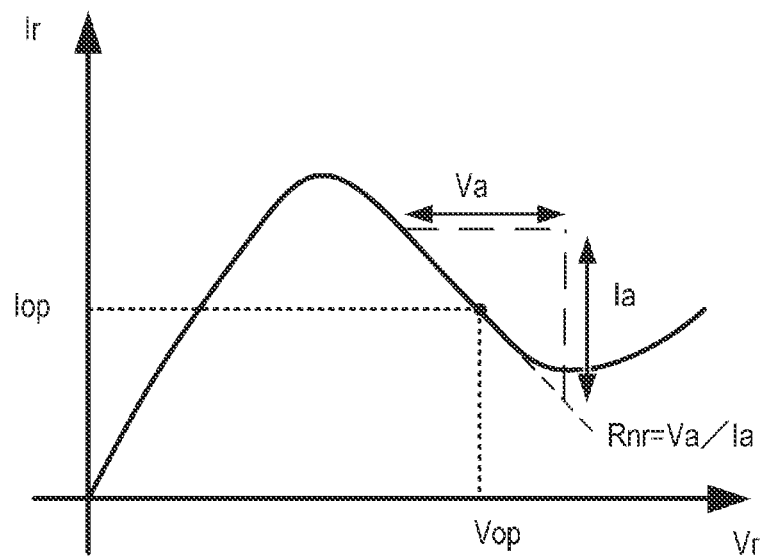

A negative resistance value Rnr of the negative resistance element 101 will now be described using FIG. 2B, which shows the same voltage-current characteristic as FIG. 2A. An inclination value (Va/Ia) of the voltage-current characteristic in a state where the operation voltage Vop is applied can be set as the negative resistance value Rnr of the negative resistance element 101. The negative resistance value Rnr differs according to the parameters of the negative resistance element 101 but is typically between 1Ω and several tens of Ω.

As noted above, the oscillation circuit 100 is connected to the voltage bias circuit 200 in order to apply the operation voltage Vop to the negative resistance element 101. More specifically, the voltage bias circuit 200 outputs a voltage Vb, whereby the operation voltage Vop is applied to the oscillation circuit 100 through the wiring. Accordingly, the voltage Vb is set in consideration of a voltage drop VΔ that occurs in the wiring and so on between the voltage bias circuit 200 and the oscillation circuit 100 so that the operation voltage Vop is applied to the oscillation circuit 100 (Vb=Vop+VΔ).

Further, as shown in FIG. 1, the oscillation circuits 111, 112, 113 are respectively connected to the voltage bias circuit 200 via the inductors 121, 122, 123. Here, in the oscillation circuit 111, one terminal A is connected to the voltage bias circuit 200 via the wiring 211, the inductor 121, and the wiring 210. Meanwhile, the other terminal B of the oscillation circuit 111, which is separate to the terminal A, is connected to the voltage bias circuit 200 via the shared wiring 220. The terminals A and B of the oscillation circuits 112, 113 are similarly connected to the voltage bias circuit 200.

Comparative Example Relating to this Embodiment

An oscillator of a comparative example relating to the oscillator 1 according to this embodiment will be described below alongside problems occurring in the oscillator of the comparative example. Further, it is assumed below that the impedances of the oscillation circuits 111, 112, 113 are set at Zr1, Zr2, Zr3, respectively, while the impedances of the wiring 211, 212, 213 are set at Zw1, Zw2, Zw3, respectively. Furthermore, the impedances of the inductors 121, 122, 123 corresponding to the oscillation circuits 111, 112, 113 are set at Zl1, Zl2, Zl3, respectively.

Figure 3A:
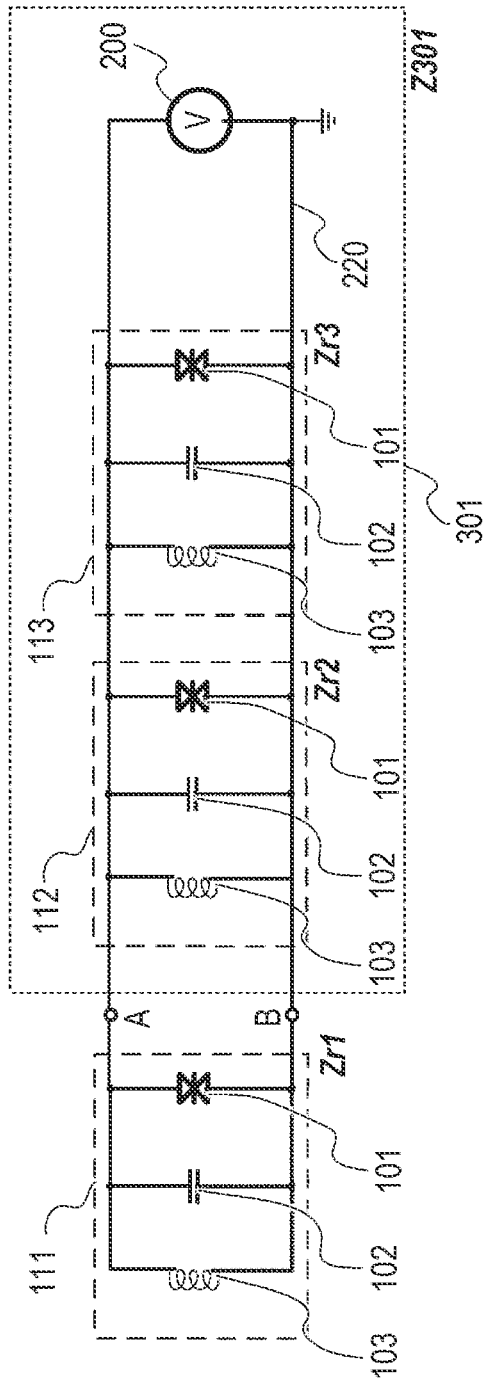
FIGS. 3A and 3B are circuit diagrams illustrating an oscillator according to a comparative example.

First, using FIG. 3A, oscillation by the oscillation circuit 111 when configured so as not to include the inductor 120 (121) will be described as the comparative example. In the comparative example, a circuit 301 in which the oscillation circuit 112, the oscillation circuit 113, and the voltage bias circuit 200 are disposed in parallel appears to be connected to the oscillation circuit 111. As long as the value of a combined impedance Z301 of the circuit 301 is sufficiently higher than the impedance Zr1, the oscillation circuit 111 is not affected by the circuit 301. Hence, the oscillation frequency ft is determined only by the elements (the negative resistance element 101, the capacitor 102, and the inductor 103) of the oscillation circuit 111. However, when the value of the combined impedance Z301 takes a value close to or below Zr1, the oscillation circuit 111 couples with the circuit 301.

Here, strictly speaking, the actual characteristics of the oscillation circuits 111, 112, 113 differ very slightly even when the design parameters remain the same. For example, strictly speaking, the respective oscillation frequencies and phases of the oscillation circuits 100 exhibit very slight differences. Therefore, when coupling occurs between the oscillation circuits 100, oscillation cannot be performed at the desired terahertz frequency ft due to the differences in the frequencies and phases. On the contrary, there is a high possibility that due to this coupling, oscillation will occur at a frequency other than the desired terahertz frequency ft. Oscillation at a frequency other than the desired terahertz frequency ft is known as "parasitic oscillation". When parasitic oscillation occurs in this manner, it becomes more difficult to realize oscillation at the desired terahertz frequency ft.

When the plurality of oscillation circuits 100 are connected to the single voltage bias circuit 200, as in the comparative example, coupling between the plurality of oscillation circuits 100 is highly likely to occur. In addition, the oscillation circuit 112 and the oscillation circuit 113 have substantially identical impedances to the oscillation circuit 111 (Zr1=Zr2=Zr3). Accordingly, the combined impedance of a parallel circuit constituted by the oscillation circuit 112 and the oscillation circuit 113 is approximately half the impedance Zr1 of the oscillation circuit 111 (Zr½). Moreover, even when the voltage bias circuit 200 exists in parallel with the other elements of the circuit 301, the impedance Z301 of the circuit 301 is not increased, and therefore the impedance Z301 does not take a higher value than Zr½. Hence, in the comparative example, Zr1>Z301 is established, and as a result, parasitic oscillation due to coupling between the oscillation circuit 111 and the circuit 301 is highly likely to occur.

Figure 3B:
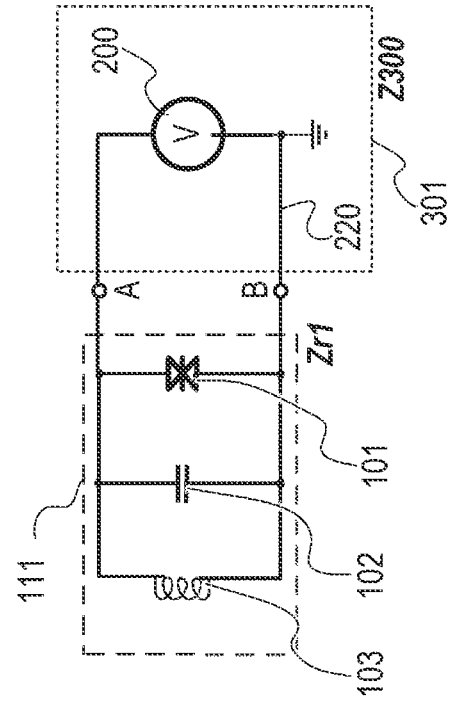

FIG. 3B, meanwhile, shows a configuration in which the oscillation circuit 111 is connected singly to the single voltage bias circuit 200. In FIG. 3B, a circuit 300 in which only the voltage bias circuit 200 is disposed appears to be connected to the oscillation circuit 111. A combined impedance Z300 of the circuit 300 is determined by the impedance of the voltage bias circuit 200, and therefore, by selecting an optimum value for the impedance of the voltage bias circuit 200, coupling can be prevented, enabling a reduction in the likelihood of parasitic oscillation.

As described above, in a configuration where the plurality of oscillation circuits 111, 112, 113 are connected to the same voltage bias circuit 200, a problem exists in that the likelihood of parasitic oscillation is higher than when the oscillation circuit 100 and the voltage bias circuit 200 are used one-to-one.

Oscillator of this Embodiment

Next, the oscillator 1 according to this embodiment, with which the problem of the comparative example can be solved, will be described using FIG. 3C. In the oscillator 1, the oscillation circuits 111, 112, 113 are connected to the same voltage bias circuit 200 via the respectively different inductors 120 (121, 122, 123). Accordingly, a circuit 310 in which the inductor 121 and the circuit 311 are disposed in series appears to be connected to the oscillation circuit 111. The circuit 311 is formed by disposing in parallel a group including the oscillation circuit 112 and the inductor 122, which are connected in series, a group including the oscillation circuit 113 and the inductor 123, which are connected in series, and the voltage bias circuit 200.

In this embodiment, the impedances Zl1, Zl2, Zl3 of the inductors 121, 122, 123 are larger than the impedances Zr1, Zr2, Zr3 of the oscillation circuits 111, 112, 113 (Zl1=Zl2=Zl3>Zr1=Zr2=Zr3). Here, the combined impedance of the circuit 310 is set as Z310, and the combined impedance of the circuit 311 is set as Z311. The circuit 310 is formed by disposing the inductor 121 and the circuit 311 in series. Accordingly, Z310 takes a value obtained by adding together Zl1 and Z310. In this embodiment, Zl1 of the inductor 121 is larger than Zr1 of the oscillation circuit 111, and therefore coupling between the oscillation circuit 111 and the inductor 121 can be prevented, enabling a reduction in the occurrence probability of parasitic oscillation. Further, the inductors 122, 123 are disposed in parallel in the circuit 311, and therefore, as long as the impedance of the voltage bias circuit 200 is set at an optimum value (a high enough value), a value no smaller than half the value obtained by adding together Zr1 and Zl1 can be acquired as Z311. In other words, Z311 can take a higher value than Zr1, and therefore coupling between the oscillation circuit 111 and the circuit 311 can also be prevented. Hence, Z310 can take a sufficiently higher value than Zr1 (a higher value than Zr1×2), and as a result, parasitic oscillation caused by coupling can be sufficiently suppressed even when a plurality of oscillation circuits are connected.

Furthermore, in this embodiment, the inductors 121, 122, 123 are disposed between the oscillation circuits 111, 112, 113 and the voltage bias circuit 200. The inductor 120 has a low impedance at low frequencies, and therefore the inductor 120 does not cause the output voltage Vb from the voltage bias circuit 200 to drop significantly in the vicinity of a low frequency from direct current upward. Here, the impedance Zr1 of the oscillation circuit 111 is typically approximately 1Ω to 10Ω, and therefore, to ensure that the bias voltage Vb and the operation voltage Vop substantially match, Zl1 is preferably within a range of several tens of milli Ω to no more than several hundred milli Ω in the vicinity of direct current. Note that this embodiment is not limited to this range, and as long as no problems occur during use, any values may be used. Further, the bias voltage Vb may be set in consideration of the voltage drop in the inductor 120.

Meanwhile, the inductor 120 has a large impedance at high frequencies. More specifically, the impedance of the inductor 120 increases in proportion to the frequency. Hence, at frequencies from a frequency fs serving as the lower limit at which the possibility of parasitic oscillation exists to the terahertz frequency region, the impedance of the inductor 120 is sufficiently high, and therefore coupling between the oscillation circuits 100 can be prevented. Note that as long as the impedance relationship (Zl1=Zl2=Zl3>Zr1=Zr2=Zr3) described using FIG. 3C is satisfied in a region extending from the lower limit frequency fs upward (i.e., at or above a predetermined frequency), the relationship does not have to be satisfied at direct current or low frequencies in the vicinity thereof. Here, the lower limit frequency fs at which parasitic oscillation occurs differs according to the parameters of the oscillation circuits 100, but is typically between several tens of KHz and several tens of MHz. Hence, by setting the frequency fs at 10 KHz (by ensuring that Zl1=Zl2=Zl3>Zr1=Zr2=Zr3 is satisfied at frequencies at or above 10 KHz), parasitic oscillation can be sufficiently suppressed. The frequency fs is also affected by parasitic elements of the wiring and voltage bias circuit 200 and so on, as well as the oscillation circuits 100, and therefore the value (the inductance) of the inductor 120 may be set by calculating the frequency fs on the basis of the parameters during actual use.

Hence, with a configuration in which the inductors 120 are used between the oscillation circuits 100 and the voltage bias circuit 200, effects of facilitating voltage application at or below the frequency fs and preventing parasitic oscillation at or above the frequency fs can both be realized.

Note that the values of the inductors 120 (121, 122, 123) of this embodiment change according to the parameters of the used oscillation circuits 100, the oscillation frequency of the terahertz waves, the form of the wiring, the configuration of the voltage bias circuit, and so on, and this can be dealt with by selecting the optimum values at the time of each change. A typical example of the values (the inductances) of the used inductors is a value within a range of several hundred nanohenries to several microhenries. The values of the inductors are not limited thereto, and as long as the conditions described in this specification are satisfied, other values can be used in a similar manner.

Furthermore, in this embodiment, the inductors 121, 122, 123 are disposed only on the terminal A side in order to separate the oscillation circuits 111, 112, 113, and the inductors 120 are not disposed on the shared wiring 220 on the terminal B side. An effect of preventing coupling between the oscillation circuits can be obtained by disposing the inductors 120 only on one side. As a result, a sufficient effect can be obtained while minimizing increases in the number of constituent elements. Further, by disposing all of the inserted inductors 120 on one terminal side, the wiring and component arrangements can be simplified. Moreover, when an oscillator or a light is constituted by a plurality of oscillation circuits, the size of the oscillator or light can be reduced by forming the plurality of oscillation circuits on the same chip. On the chip, one terminal of each oscillation circuit is connected to a substrate potential, similarly to a typical configuration, and therefore this embodiment can be applied without significantly altering the chip configuration from a typical configuration. Note that the inductors 120 do not necessarily have to be disposed on only one terminal, and the inductors 120 may be disposed on both terminals. Moreover, the inductors 120 may be disposed on the terminal B side rather than the terminal A side.

According to this configuration, in an oscillator in which a plurality of oscillation circuits (resonators) having negative resistance are driven by the same voltage bias circuit, the respective oscillation circuits can be caused to oscillate with stability at a desired terahertz frequency.

Second Embodiment

Figure 4A:
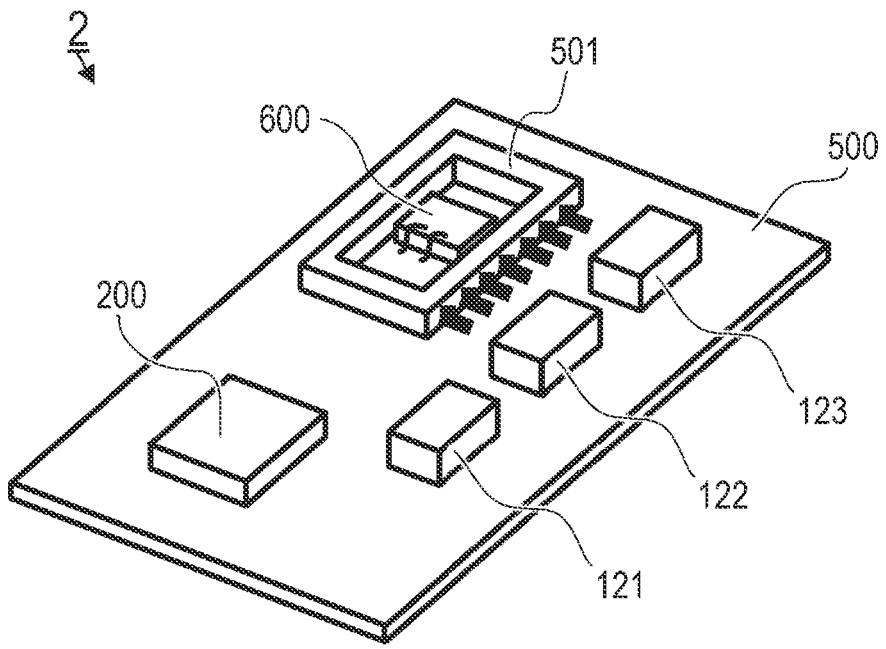

An arrangement of the inductors 121, 122, 123 provided in the oscillator 1 according to the first embodiment will be described as an oscillator 2 according to a second embodiment. The oscillator 2 according to this embodiment will be described using FIGS. 4A to 4C, FIGS. 5A and 5B. As shown in FIG. 4A, the oscillator 2 includes a printed circuit board 500 (PCB), a package 501 (PKG), a chip 600, and the voltage bias circuit 200.

Figure 4B:
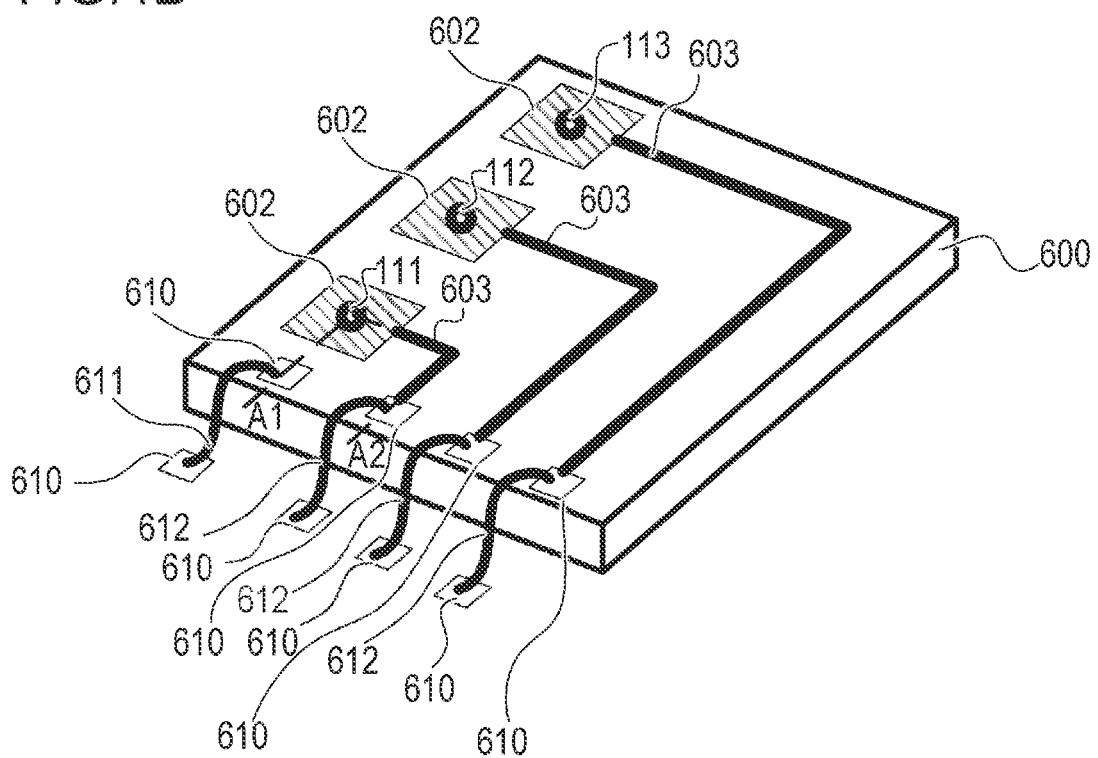

As shown in FIG. 4B, the chip 600 includes the oscillation circuits 100 (111, 112, 113), each of which includes the negative resistance element 101, and is packaged in the package 501. The chip 600 also includes antennae 602, wiring 603, electrodes 610, a wire 611, and wires 612.

As shown in FIG. 4A, the package 501, the voltage bias circuit 200, and the surface-mounted (SMD) inductors 121, 122, 123, which are provided in packaged form, are disposed on the printed circuit board 500. The voltage bias circuit 200 is electrically connected to the oscillation circuits 111, 112, 113 on the chip 600 via the inductors 121, 122, 123. This connection is established via wiring (not shown) provided on the printed circuit board 500 and the package 501. Further, the package 501 holds (supports) the chip 600.

As shown in FIG. 4B, the wiring of the chip 600 is electrically connected to the wiring of the package 501 by wire bonding. The wire bonding is realized by electrically connecting the electrodes 610 on the chip 600 to the electrodes 610 on the package 501 via the wire 611 and the wires 612.

Note that the chip size of the chip 600 is typically between several millimeters square and several tens of millimeters square. Further, FIG. 4A shows a configuration in which the plurality of oscillation circuits are all disposed on the single chip 600, but this embodiment is not limited to this configuration, and the oscillation circuits may be disposed respectively on a plurality of chips.

FIG. 4C is a pattern diagram showing an A1-A2 cross-section of FIG. 4B. As shown in FIG. 4C, an insulating film 620 is disposed on the chip 600. The oscillation circuit 100 (111) is disposed on the chip 600 in a thickness direction of the insulating film 620 (the chip 600). One of the terminals of the oscillation circuit 100 is connected to the substrate potential of the chip 600. The other terminal is connected to the antenna 602, which is disposed on the upper side of the oscillation circuit 100 (111). The antenna 602 is connected to the electrode 610 on an A2 side by the wiring 603 on the chip 600. The reference potential of the chip 600 is connected to the electrode 610 on an A1 side by wiring 613 penetrating the insulating film. Here, the size of the antenna 602 may be set at an optimum size in accordance with the oscillation frequency of the terahertz waves, and may be several hundred micrometers (μm) square, for example. Further, the antenna 602 is not limited to a square antenna, and as long as terahertz waves can be oscillated, any antenna shape may be employed.

Furthermore, in this embodiment, the inductors 121, 122, 123 are formed as surface-mounted devices (SMDs) on the printed circuit board 500, and therefore elements having the required parameters can be selected and used as desired. By employing surface-mounted devices as the inductors 121, 122, 123, the mounting area can be suppressed, enabling an increase in the degree of integration. Since in this embodiment, the inductors 120 must be provided in an identical number to the number of oscillation circuits 100, it is important to suppress the mounting area.

According to this embodiment, even when a plurality of oscillation circuits having negative resistance are driven by the same voltage bias circuit, the oscillator 2, which causes the respective oscillation circuits to oscillate with stability at the desired terahertz frequency, can be provided by means of a simple configuration.

Note that in this embodiment, a configuration in which the inductors 121, 122, 123 are disposed on the printed circuit board 500 was described, but this embodiment is not limited to this configuration. As shown in FIG. 5A, the inductors 121, 122, 123 can also be disposed on the package 501 together with the chip 600. In so doing, there is no need to draw wiring from the respectively oscillation circuits to the exterior of the package 501, and therefore the number of pins on the package 501 and the amount of wiring on the printed circuit board 500 can be reduced. As a result, a small oscillator can be realized.

Note that in this embodiment, a configuration in which the chip 600 is disposed on the package 501 was described, but this embodiment is not limited to this configuration. As shown in FIG. 5B, the chip 600 may be disposed directly on the printed circuit board 500. In so doing, the package 501 can be omitted, and as a result, the oscillator can be formed from fewer configurations.

Third Embodiment

An oscillator 3 according to a third embodiment differs from the oscillator 2 according to the second embodiment in the arrangement of the inductors 121, 122, 123. The oscillator 3 will be described below using FIGS. 6A to 7B.

Figure 6A:
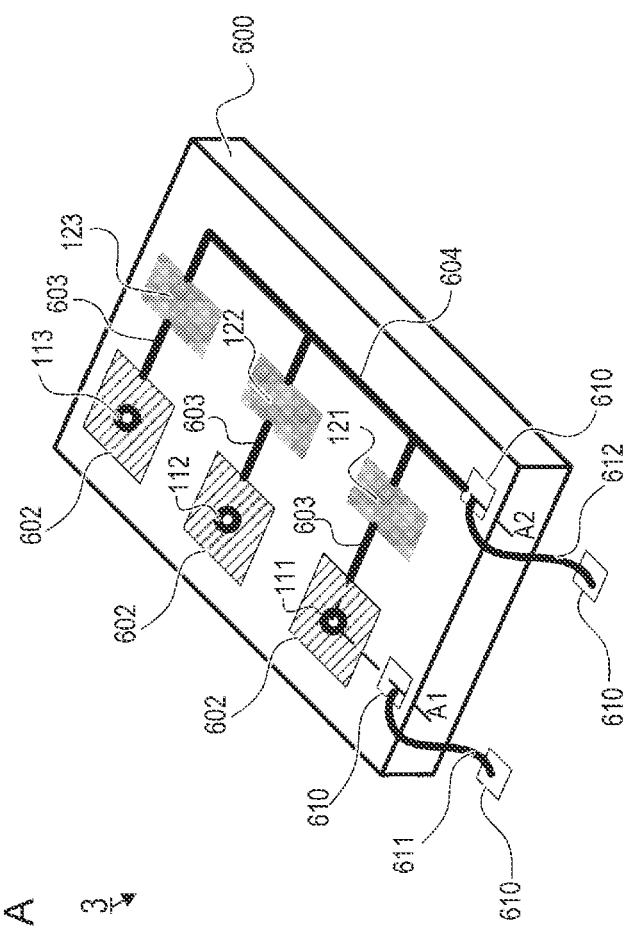
FIGS. 6A and 6B are views showing an oscillator according to a third embodiment.

In the oscillator 3, as shown in FIG. 6A, the inductors 120 (121, 122, 123) are disposed on the chip 600, the chip 600 including the oscillation circuits 100 (111, 112, 113). The inductors 120 are connected to the oscillation circuits 100 and the electrodes 610 via the wiring 603 and wiring 604 on the chip 600.

Figure 6B:
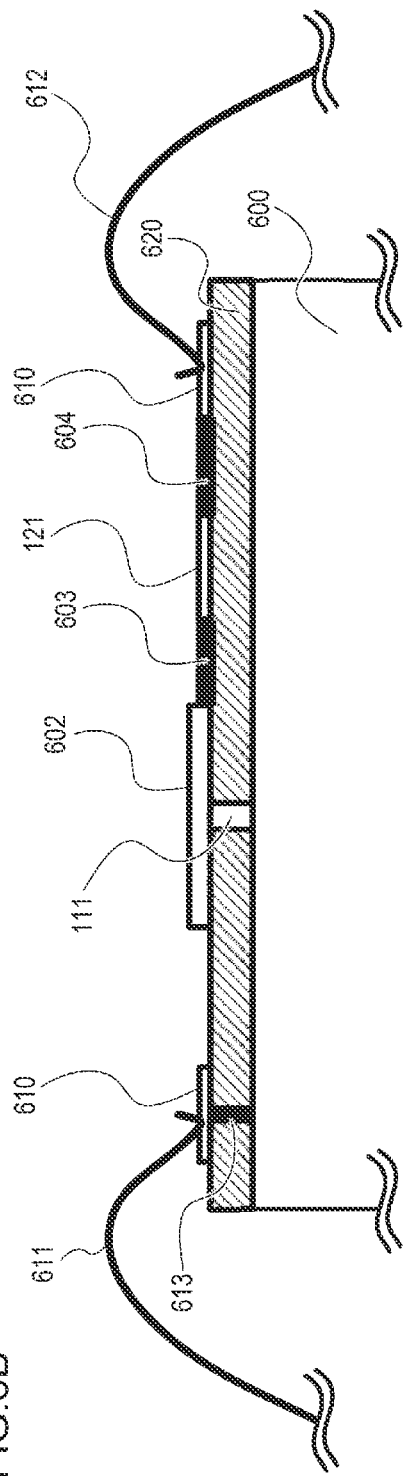
Figure 7A:
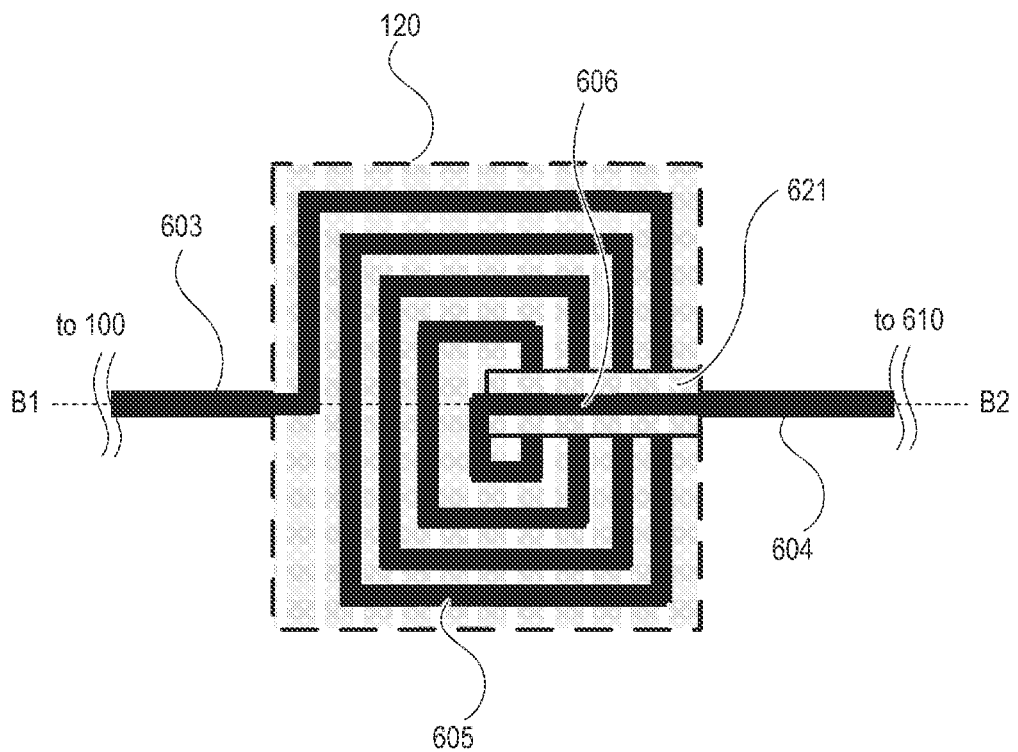
FIGS. 7A and 7B are views illustrating an inductor according to the third embodiment.
Figure 7B:
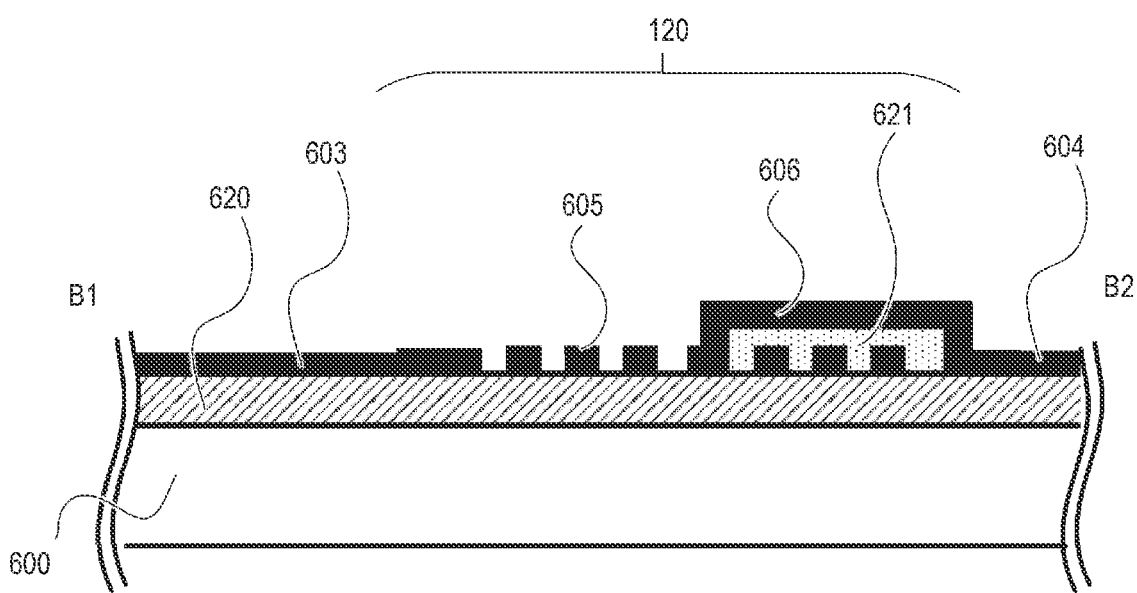

FIG. 6B is an A1-A2 sectional view of FIG. 6A. FIG. 7A is an enlarged view of the periphery of the inductor 120, and FIG. 7B is a B1-B2 sectional view of FIG. 7A. As shown in FIG. 7A, the inductor 120 is formed by winding metal wiring 605 into a loop shape. One terminal of the metal wiring 605 is connected to the wiring 603. An insulating film 621 is formed on the metal wiring 605, and a central end portion of the metal wiring 605 is connected to wiring 606 on the insulating film 621. Further, the central end portion of the metal wiring 605 is connected to the wiring 604 via the wiring 606. The inductor 120 has a simple configuration acquired by forming an insulating film and metal wiring on a loop and can therefore be formed easily on the chip 600, on which the negative resistance element 101 and so on are formed.

According to this embodiment, in contrast to the second embodiment in which the inductors 120 are disposed on the package 501, the inductors 120 are disposed on the chip 600 on which the oscillation circuits 100 are formed, and therefore an increase in the surface area occupied thereby on the oscillator can be suppressed. Hence, even when a plurality of oscillation circuits having negative resistance are driven by the same voltage bias circuit, an oscillator that causes the respective oscillation circuits to oscillate with stability at the desired terahertz frequency can be provided by means of a simple configuration.

Note that the inductors according to this embodiment are not limited to the configuration described above, and any inductors that can be disposed on a chip may be used.

Fourth Embodiment

An oscillator 4 according to a fourth embodiment includes shunt elements for preventing parasitic oscillation in addition to the configurations of the oscillator 1 according to the first embodiment. The oscillator 4 according to this embodiment will be described using circuit diagrams in FIGS. 8A and 8B.

Figure 8A:
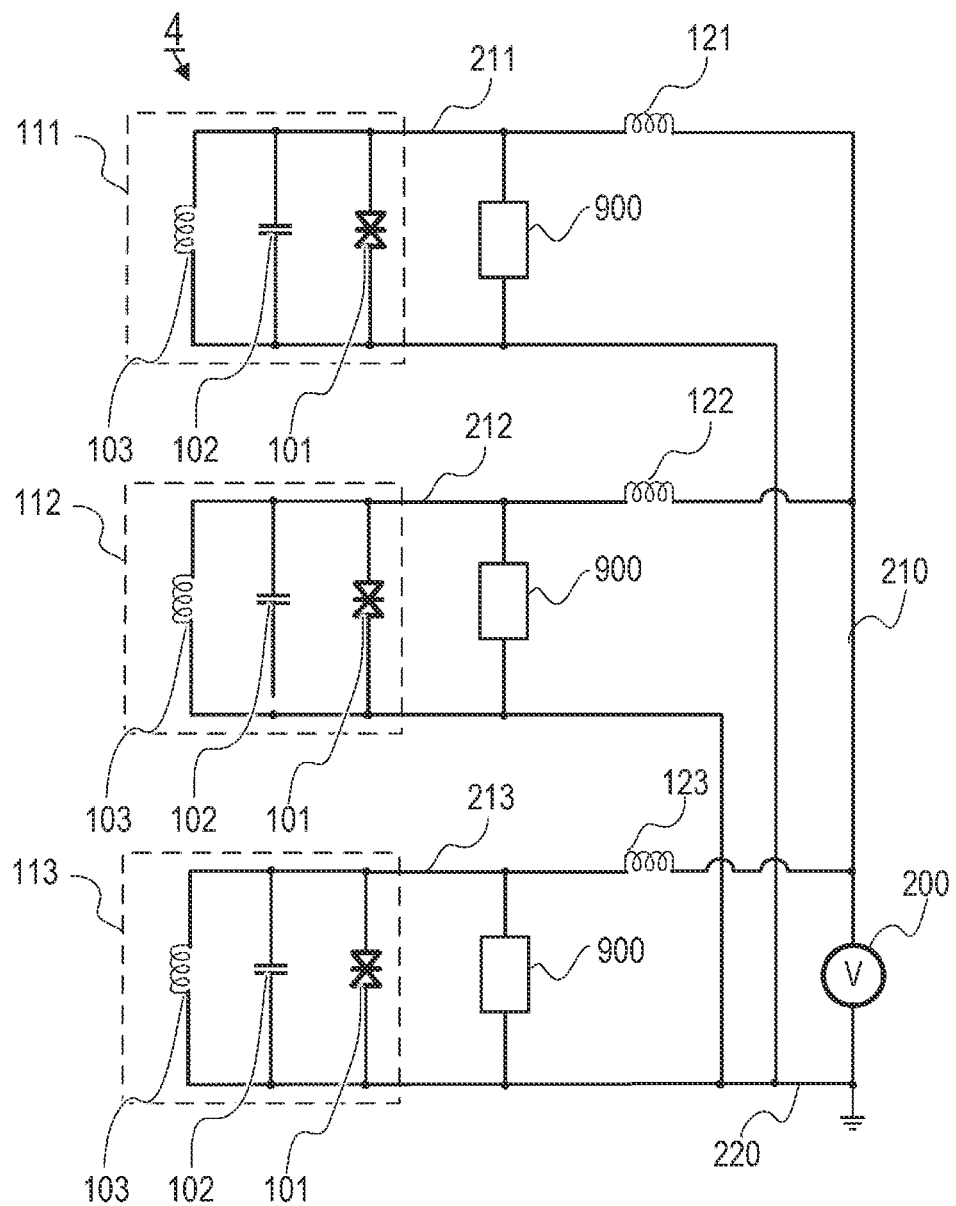
FIGS. 8A and 8B are circuit diagrams of an oscillator according to a fourth embodiment.

As shown in FIG. 8A, the oscillator 4 includes shunt elements 900. Each shunt element 900 is disposed in series with the negative resistance element 101 and coupled to the oscillation circuit 100 so as to prevent coupling between the oscillation circuit 100 and an external element. Thus, the shunt element 900 suppresses oscillation of the oscillation circuit 100 at frequencies other than the desired terahertz oscillation frequency ft.

Typically, as shown in FIG. 14B, the wiring connecting the voltage bias circuit 200 to the oscillation circuit 100 includes a parasitic inductor, a parasitic capacitor, and so on (elements 400 to 404). As a result, an oscillation circuit that oscillates at a different frequency to the desired frequency ft may be formed between the elements of the oscillation circuit 100 and the parasitic elements of the voltage bias circuit 200, leading to parasitic oscillation.

Also typically, the voltage bias circuit 200 is itself not an ideal voltage source. More specifically, as shown in FIG. 14B, the voltage bias circuit 200 includes an ideal voltage source 201 and a parasitic inductor, a parasitic resistor, a parasitic capacitor, and so on (elements 411, 412, 413). Therefore, parasitic oscillation may occur between the elements of the oscillation circuit 100 and the parasitic elements of the voltage bias circuit 200 other than the voltage source 201.

Hence, to suppress parasitic oscillation in this embodiment, as shown in FIG. 8A, the shunt element 900 and the oscillation circuit 100 are disposed in parallel relative to the voltage bias circuit 200. Here, the shunt element 900 has a substantially identical impedance to the resistance value Rr of the negative resistance element 101 of the oscillation circuit 100. Accordingly, the oscillation circuit 100 and the shunt element 900 can be coupled so that loss can be generated in the shunt element 900. The oscillation circuit 100 can be prevented from coupling with external wiring and the voltage bias circuit 200 by the loss generated in the shunt element 900, and as a result, parasitic oscillation can be suppressed. Note that the specific impedance range of the shunt element 900 is preferably a range of no more than double the resistance value Rr, and more preferably a range of no more than 1.5 times the resistance value Rr.

The position in which the shunt element 900 is disposed must also be taken into consideration. More specifically, the length of the wiring connecting the oscillation circuits 100 (111, 112, 113) to the shunt element 900 is set at no more than ¼ of the wavelength λ of the maximum frequency (the cutoff frequency on the high frequency side) at which parasitic oscillation is to be suppressed. The reason for this is that when the wavelength of an AC signal is short, the phase changes greatly in response to even small changes in the position of the wiring, and as a result, equivalent capacitance or equivalent inductance is generated due to reflection at the wiring end. The shunt element 900 is disposed close to the oscillation circuit particularly in a case where parasitic oscillation in the vicinity of a gigahertz to terahertz frequency is to be suppressed. By setting the distance from the oscillation circuit 100 to the shunt element 900 at no more than ¼ of the wavelength λ, the occurrence of equivalent capacitance or equivalent inductance due to the effect of reflection at the wiring end can be suppressed, and as a result, parasitic oscillation can be suppressed.

Figure 8B:
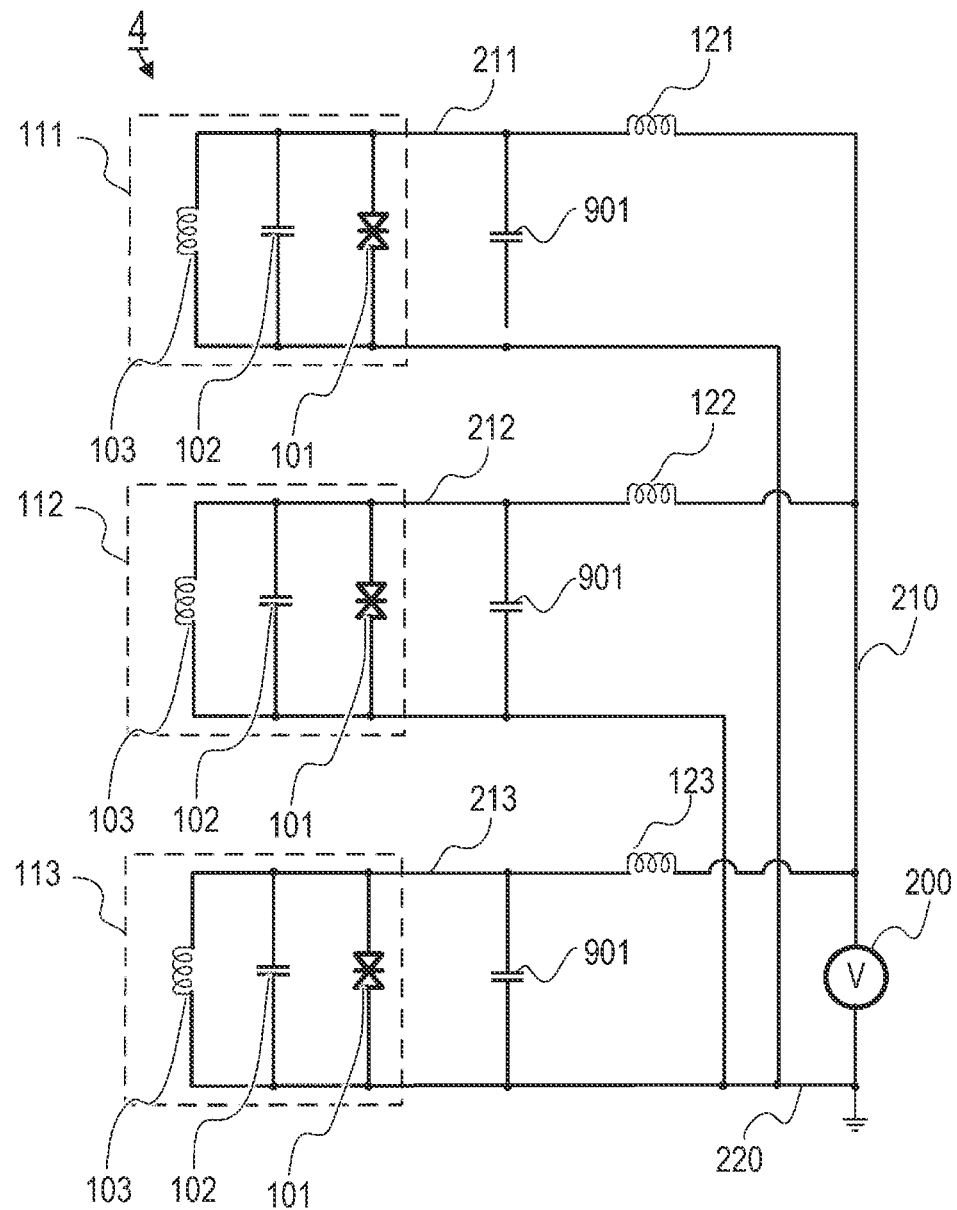

Further, in this embodiment, as shown in FIG. 8B, a capacitive element 901 is used as the shunt element 900. With the capacitive element 901, the impedance can easily be reduced in proportion to the frequency. With the capacitive element 901, therefore, a low impedance can be obtained continuously from a specific frequency up to a high frequency region. For example, with the capacitive element 901, a low impedance can be obtained over a wide range from several megahertz to several terahertz, whereby parasitic oscillation can be suppressed in this frequency range. In the absence of the inductors 120, however, the capacitive elements 901 couple with each other when the plurality of oscillation circuits 100 are connected, and as a result, parasitic oscillation, and in certain cases an oscillation stoppage, may occur due to coupling between adjacent oscillation circuits 100.

In the oscillator 4 according to this embodiment, however, the inductors 120 (121, 122, 123) are provided between the oscillation circuits 100, and therefore a situation in which the oscillation circuit 100 and the shunt element 900 associated therewith couple with another oscillation circuit 100 or another shunt element 900 can be prevented from occurring.

With the oscillator according to this embodiment, even when a plurality of oscillation circuits having negative resistance are driven by the same voltage bias circuit, parasitic oscillation can be suppressed, and as a result, the respective oscillation circuits can be caused to oscillate with stability at a desired terahertz frequency.

Fifth Embodiment

An oscillator 5 according to a fifth embodiment differs from the oscillator 4 according to the fourth embodiment in the configuration of the shunt element for preventing parasitic oscillation. The oscillator 5 according to this embodiment will be described using FIGS. 9A and 9B.

Figure 9A:
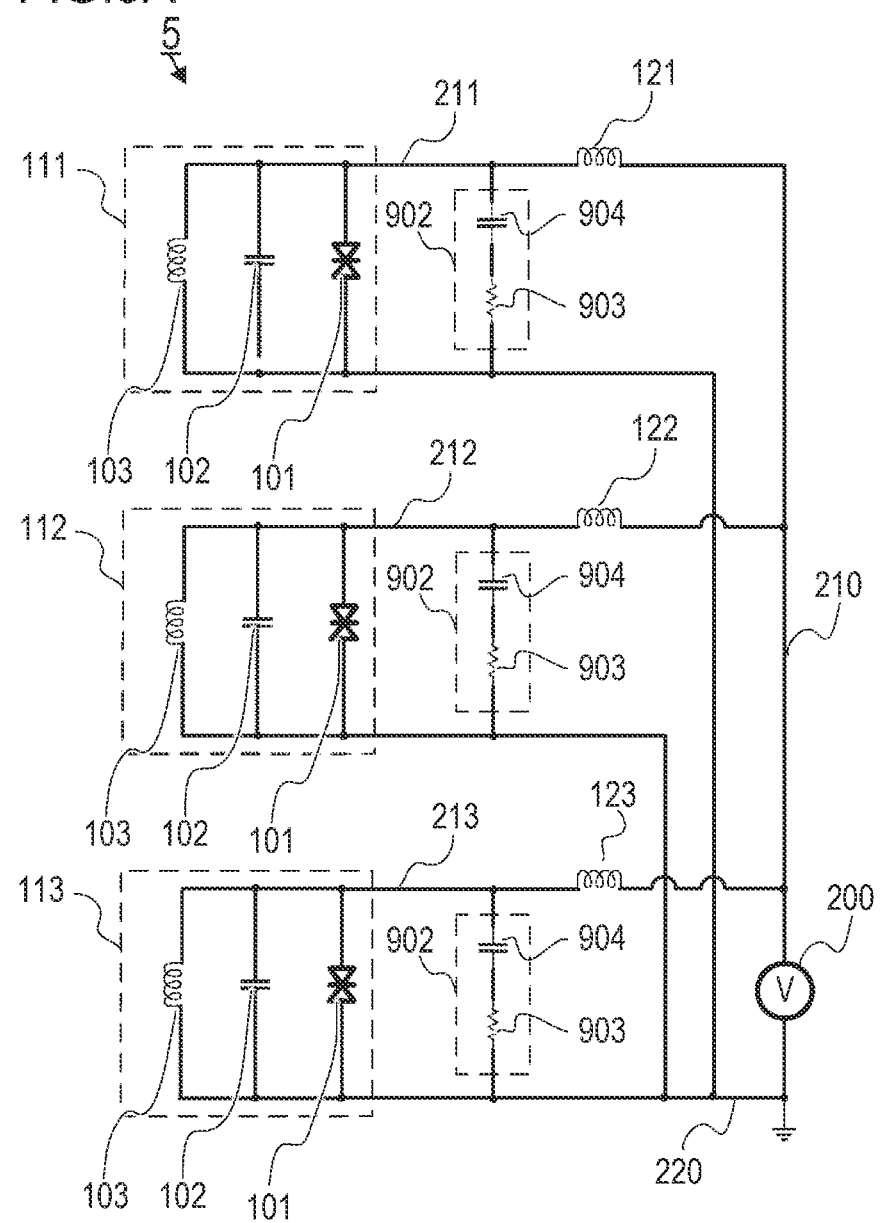
FIGS. 9A and 9B are circuit diagrams of an oscillator according to a fifth embodiment.

In this embodiment, as shown in FIG. 9A, a resistive-capacitive element 902 is used as the shunt element. The resistive-capacitive element 902 is formed by connecting a resistive element 903 and a capacitive element 904 in series.

With the resistive-capacitive element 902, although the number of constituent elements increases in comparison with the capacitive element 901 according to the fourth embodiment, parasitic oscillation can be suppressed with stability over a wide frequency range. Moreover, by providing the resistive element 903 and the capacitive element 904, a steady current does not flow in the frequency region near direct current, and therefore power consumption does not increase.

Here, when loss is not generated in the shunt element, it may be impossible to prevent the oscillation circuit from coupling with another site. Accordingly, when the capacitive element 901 is used as the shunt element, as in the fourth embodiment, the impedance decreases as the frequency increases, and it may therefore be impossible to increase the capacitance value sufficiently to prevent the loss from decreasing excessively, particularly at high frequencies.

In this embodiment, however, in a frequency region that is considerably higher than a frequency determined by the time constants of the resistive element 903 and the capacitive element 904, the capacitive element 904 enters a short-circuited state, and as a result, sufficient loss can be generated in the resistive element 903. Therefore, by including the resistive element 903 in the shunt element, the capacitance value of the capacitive element 904 can be increased, and as a result, the loss generated by the shunt element can be maintained at a fixed amount.

In other words, when the resistive-capacitive element 902 is used as the shunt element, due to the inclusion of the resistive element 903, the capacitance value can be increased in comparison with a case where the capacitive element 901 is used as the shunt element, and as a result, sufficient loss can be obtained even at low frequencies. Hence, with the oscillator 5 according to this embodiment, parasitic oscillation can be suppressed over a wider frequency range.

With the oscillator 5 according to this embodiment, even when a plurality of oscillation circuits having negative resistance are driven by the same voltage bias circuit, parasitic oscillation can be suppressed more effectively, and as a result, the respective oscillation circuits can be caused to oscillate with stability at a desired terahertz frequency.

Figure 9B:
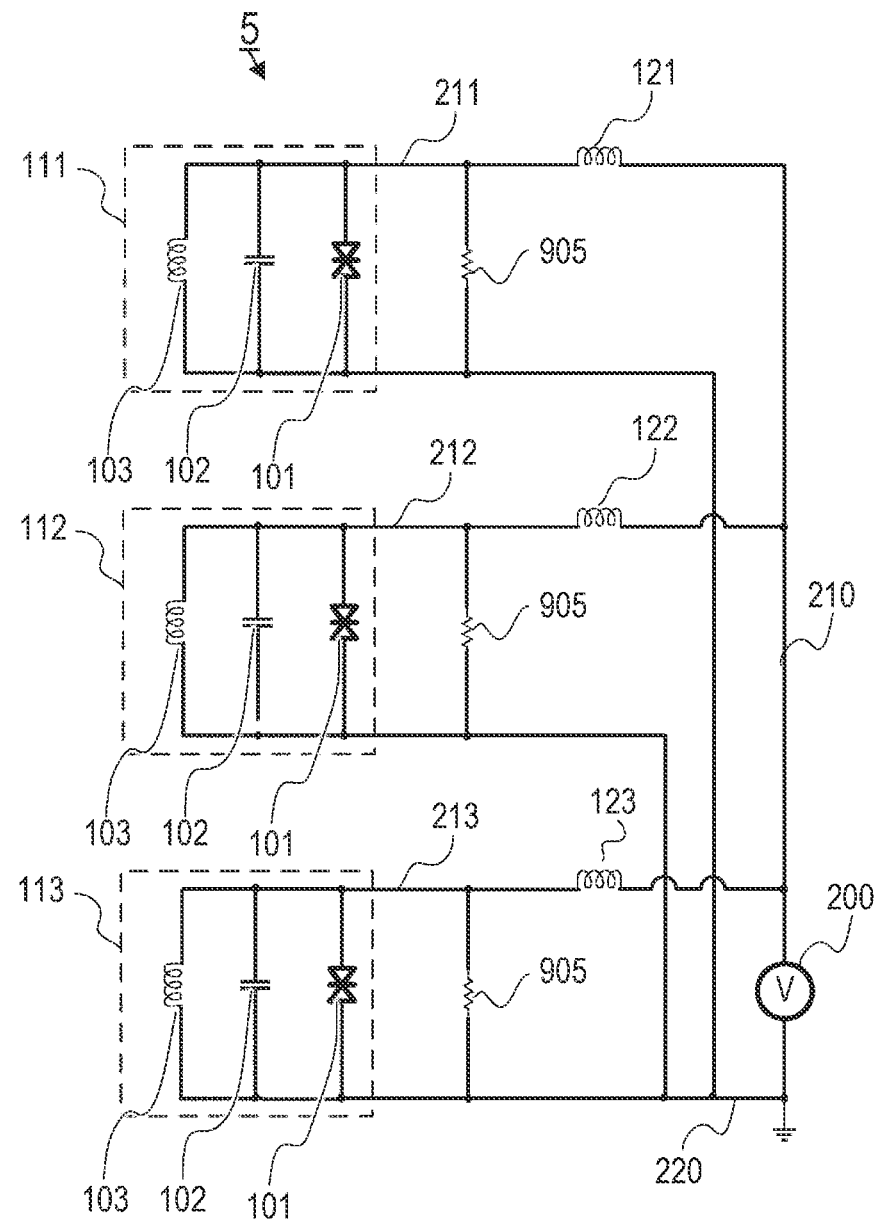

Note that instead of a shunt element having a capacitive element such as the capacitive element 901 or the resistive-capacitive element 902, a resistive element 905, as shown in FIG. 9B, may be used as the shunt element.

A configuration in which the resistive element 905 is used as the shunt element is a simple configuration employing only resistance, and therefore, in comparison with a shunt element including a capacitive element, sufficient loss can be generated more easily, and it is also easy to control the impedance. With a shunt element constituted only by the resistive element 905, therefore, the likelihood of coupling between the oscillation circuits can be reduced even further than with a shunt element including a capacitive element.

In other words, with a configuration in which the capacitive element 901 or the resistive-capacitive element 902 is used as the shunt element, the need to avoid coupling between the oscillation circuits is greater than with a configuration in which the resistive element 905 is used as the shunt element. It may therefore be said that particularly in a shunt element having capacitance, the coupling suppression effect realized by the inductor 120 is extremely high. Nevertheless, even when the resistive element 905 is used as the shunt element, a sufficient effect for suppressing coupling between the oscillation circuits can be obtained.

Sixth Embodiment

An oscillator 6 according to a sixth embodiment differs from the oscillators according to the other embodiments in the relationship between the number of shunt elements and the inductors. In all other respects, the oscillator 6 is identical to a combination of the first to fifth embodiments. The oscillator 6 according to this embodiment will be described using FIGS. 10A to 11B.

Figure 10A:
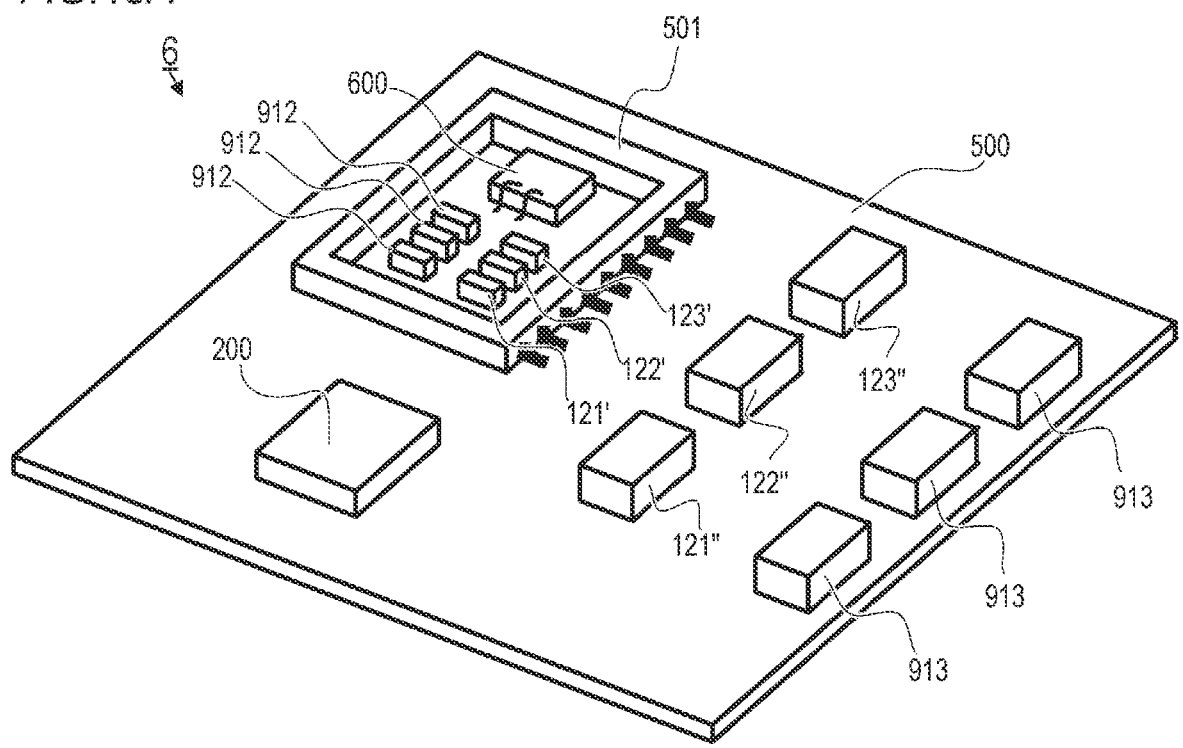
FIGS. 10A and 10B are views showing an oscillator according to a sixth embodiment.
Figure 10B:
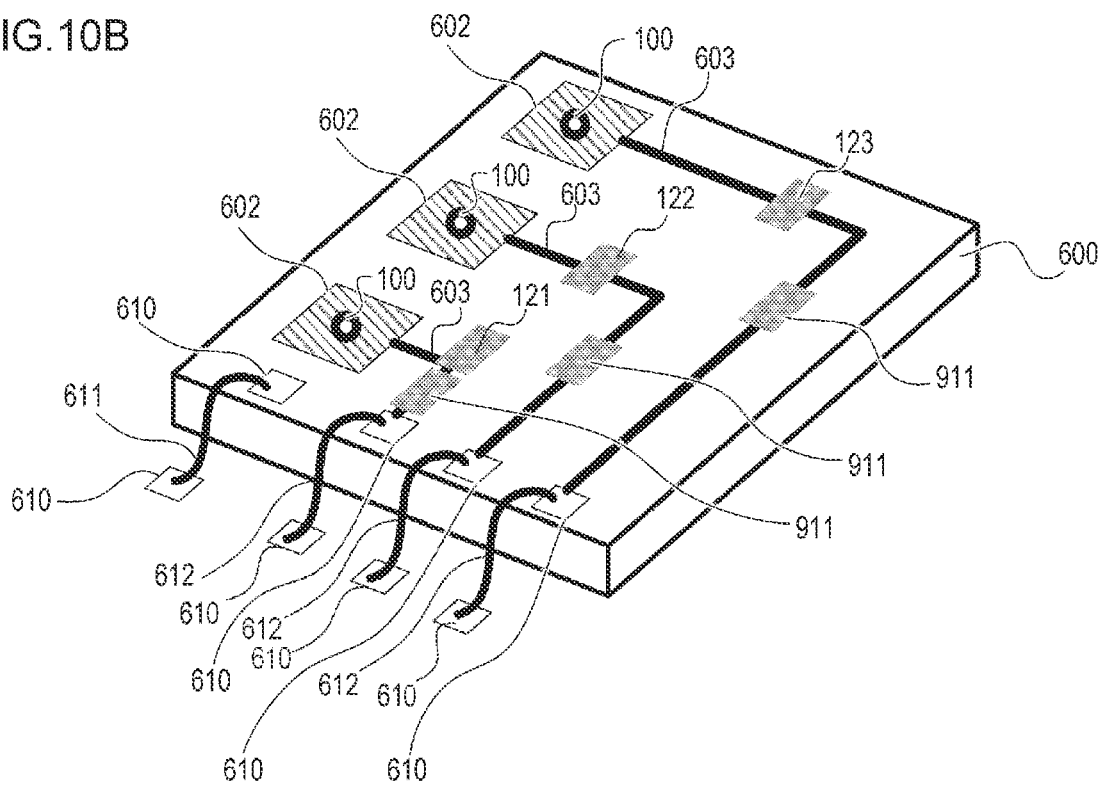
Figure 11A:
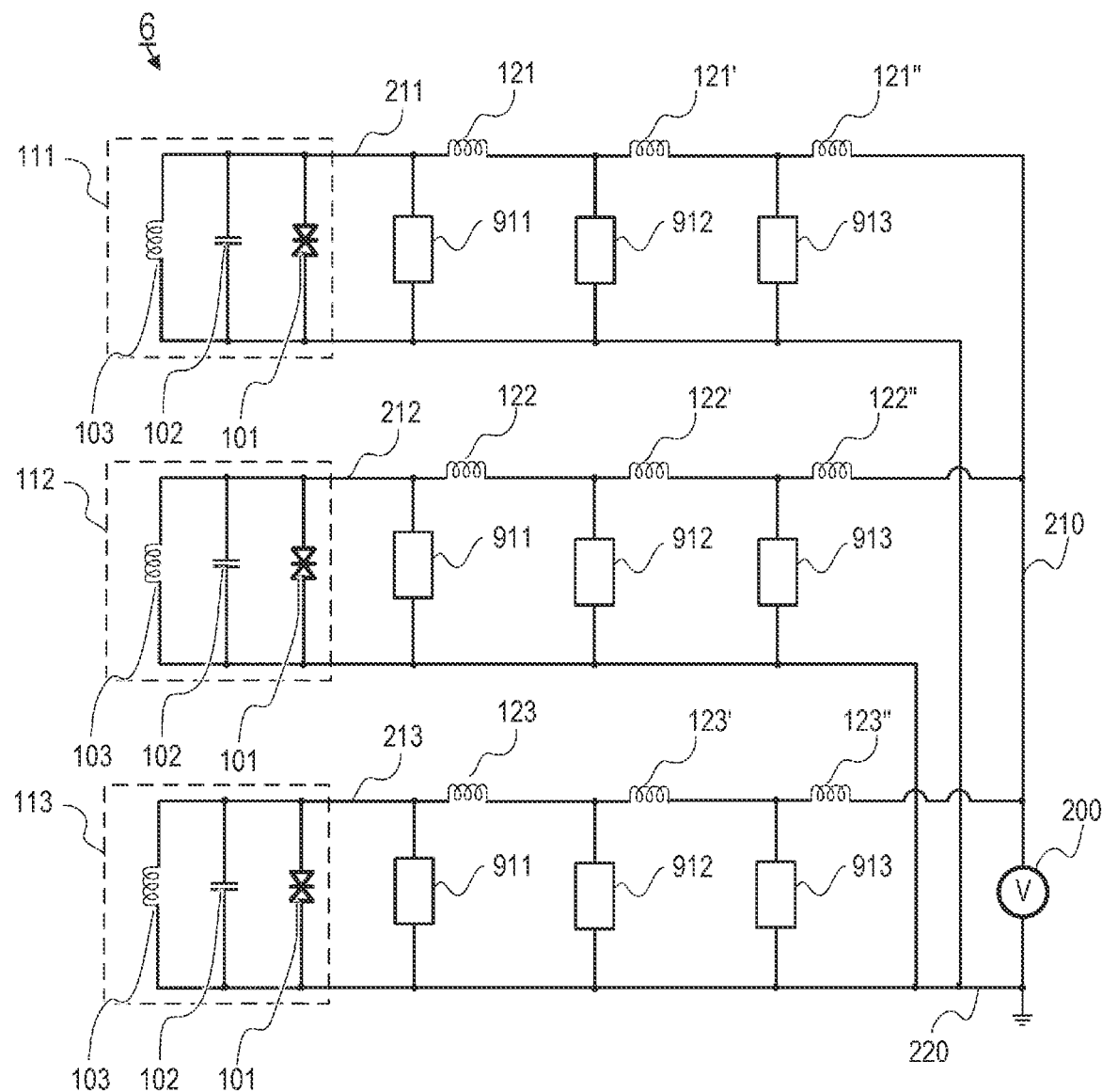

FIG. 10A shows the configuration of the oscillator 6, and FIG. 10B shows the configuration of the chip 600 provided in the oscillator 6 in detail. In the oscillator 6, as shown in FIGS. 10A and 10B, shunt elements 911 are disposed on the chip 600, shunt elements 912 are disposed on the package 501, and shunt elements 913 are disposed on the printed circuit board 500. Further, the inductors 121 to 123 are disposed between the shunt elements 911 and the shunt elements 912. Inductors 121' to 123' are disposed between the shunt elements 912 and the shunt elements 913. Inductors 121" to 123" are disposed between the shunt elements 913 and the voltage bias circuit 200. As shown in the circuit diagram in FIG. 11A, therefore, the oscillator 6 includes pluralities of inductors disposed on multiple levels.

The shunt elements 911 to 913 are respectively disposed close to the oscillation circuits 100 in order to suppress parasitic oscillation at high frequencies. More preferably, the respective distances from each oscillation circuit 100 to the shunt elements 911 to 913 are set at no more than ¼ of the wavelength at the parasitic oscillation suppression frequencies of the respective shunt elements. Here, the frequency at which the shunt element 911 exhibits a parasitic oscillation prevention effect is set as fs1, the frequency at which the shunt element 912 exhibits a parasitic oscillation prevention effect is set as fs2, and the frequency at which the shunt element 913 exhibits a parasitic oscillation prevention effect is set as fs3. The frequencies of the respective shunt elements increase in order from the shunt element closest to the oscillation circuit, and therefore have a relationship of fs1>fs2>fs3.

Further, in this embodiment, the impedances (inductances) of the inductors 120 are set to decrease in order from the inductor closest to the oscillation circuit 100. Here, the impedance of the inductor 121 (122, 123) is set as Zlm1, the impedance of the inductor 121' (122', 123') is set as Zlm2, and the impedance of the inductor 121" (122", 123") is set as Zlm3. In this case, a relationship of Zlm1<Zlm2<Zlm3 is established. Here, the size of the inductor increases as the impedance thereof increases. Hence, when the impedance of the inductors 120 disposed on the chip 600 is large, more of the surface area of the chip 600 is occupied thereby, and there is therefore an upper limit on the impedance. Further, when the impedance of the inductors 120 disposed in the package 501 is large, the surface-mounted devices increase in size, leading to an increase in the size of the package 501. In this embodiment, the impedances of the inductors decrease in order of proximity to the chip 600, and therefore the mounting area of the chip 600 and the package 501 can be suppressed.

At the frequency fs1, the impedance Zlm1 takes a value that is substantially identical to or larger than the impedance Zr1 of the oscillation circuit 100. Hence, at frequencies no smaller than the frequency fs1, loss is generated by the shunt element 911, and coupling with an external element can be prevented. Furthermore, even at a frequency at which the loss generated by the shunt element 911 is insufficient, loss can be generated by the inductor 121 (122, 123) at that frequency, and therefore the electromagnetic waves of the frequency do not leak to the outside. The relationship between the shunt element 912 and the inductor 121' (122', 123') and the relationship between the shunt element 913 and the inductor 121" (122", 123") are similar. Here, FIG. 11B is a pattern diagram showing the relationships of the values of the impedances Zlm1 to Zlm3 to the frequency, according to this embodiment. The impedances Zlm1 to Zlm3 continuously take values that are substantially identical to or larger than the impedance Zr1.

Hence, in this embodiment, by disposing the inductors between the plurality of shunt elements, parasitic oscillation can be suppressed by the shunt elements without the need to significantly increase the mounting area. Moreover, parasitic oscillation can be suppressed over a wide frequency range by the plurality of shunt elements. With the oscillator according to this embodiment, even when a plurality of oscillation circuits having negative resistance are driven by the same voltage bias circuit, parasitic oscillation can be suppressed, and as a result, the respective oscillation circuits can be caused to oscillate with stability at a desired terahertz frequency.

Note that in this embodiment, a configuration in which the shunt elements 911 are disposed on the chip 600, the shunt elements 912 are disposed on the package 501, and the shunt elements 913 are disposed on the printed circuit board 500 was described, but this embodiment is not limited thereto, and a configuration in which one of the three types of shunt elements is omitted or a configuration in which four or more types of shunt elements are disposed may also be employed.

Seventh Embodiment

In a seventh embodiment, an oscillator 7 having a voltage bias circuit that applies an AC voltage rather than a voltage bias circuit that applies a DC voltage will be described. The oscillator 7 according to this embodiment will be described using FIGS. 12A and 12B.

Figure 12A:
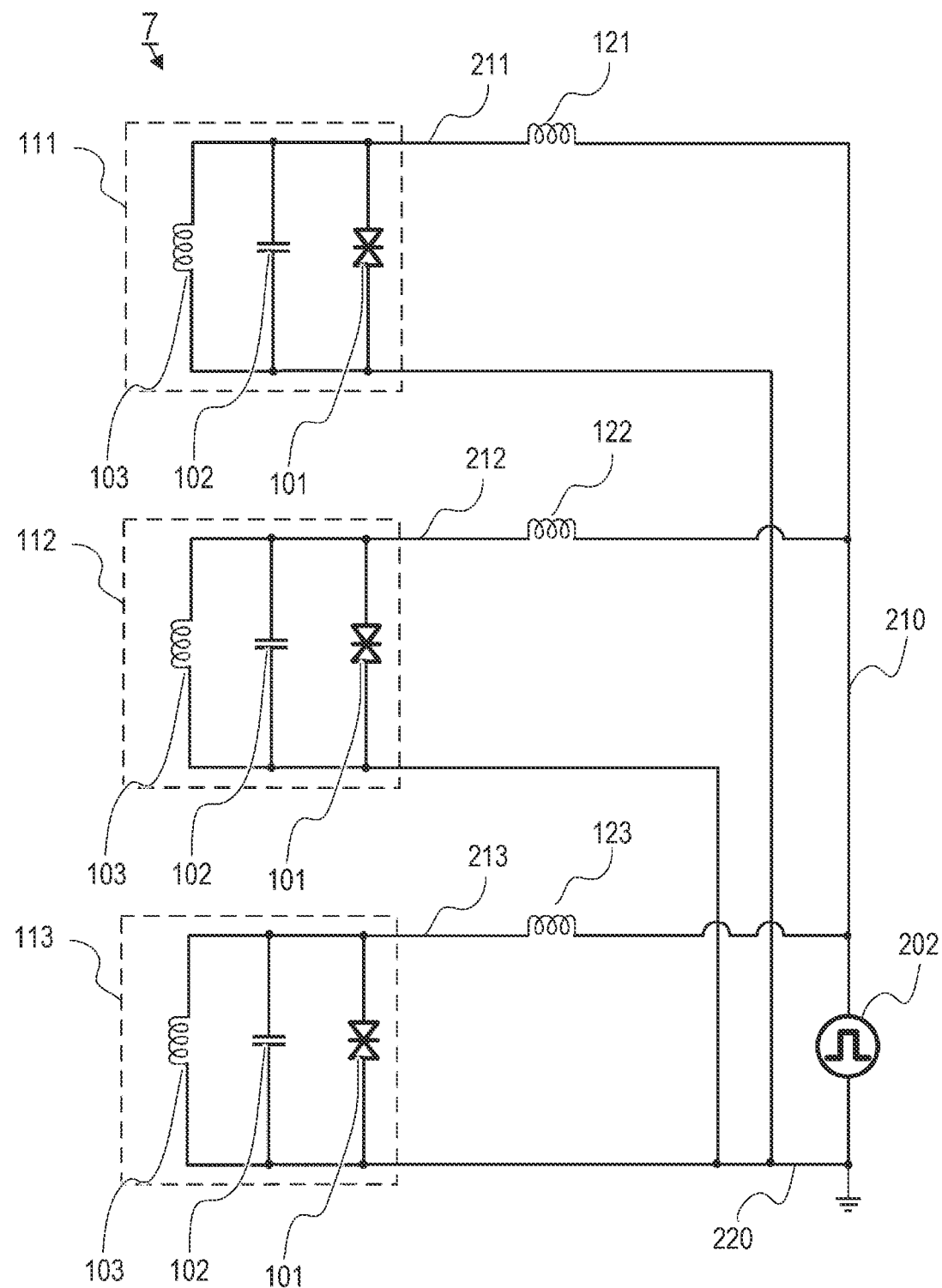
FIGS. 12A and 12B are views illustrating an oscillator according to a seventh embodiment.

In the first embodiment, the voltage bias circuit 200 used in the oscillator 1 applies a DC voltage. In this embodiment, as shown in FIG. 12A, a voltage bias circuit 202 that applies an AC voltage is used in the oscillator 7 instead of the voltage bias circuit 200.

Figure 12B:
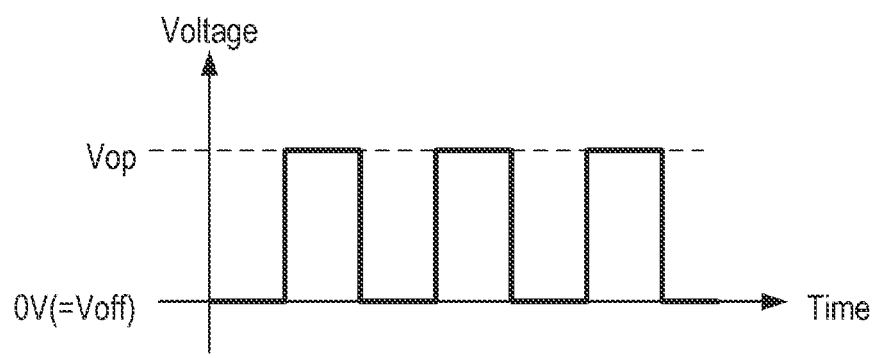

The voltage bias circuit 202 generates AC voltages to be applied to the oscillation circuits 100. More specifically, as shown in FIG. 12B, at a certain frequency fac, the voltage bias circuit 202 uses voltages that vary between the operation voltage Vop for oscillating terahertz waves and a voltage value Voff for stopping oscillation of the terahertz waves. Thus, terahertz waves can be oscillated and stopped repeatedly at the frequency fac. Note that the voltage value Voff may be any voltage value outside the negative resistance region NR, for example 0 V. The frequency fac is a considerably lower frequency than the terahertz oscillation frequency (30 GHz to 30 THz). A frequency within a range of several Hz to several MHz is used as the frequency fac, but as long as no problems arise during use, other frequencies may be used.

By repeatedly oscillating and stopping terahertz waves, states in which the terahertz waves are emitted and not emitted can be established repeatedly. Thus, when terahertz oscillation is stopped, an offset noise component of the terahertz waves emitted by another element can be ascertained. Hence, in a configuration where the oscillator is used in relation to a camera that irradiates an object with terahertz waves and captures the terahertz waves reflected by the object, noise components other than those derived from the light can be removed. As a result, a terahertz camera with a high SN ratio can be realized.

With the oscillator according to this embodiment, terahertz waves can be oscillated and stopped repeatedly, and as a result, the offset noise component of the terahertz waves can be ascertained. With the oscillator of this embodiment, the offset component can be ascertained, and therefore, when the oscillator is used in a light or a camera, the SN ratio can be improved.

Note that in a configuration using the resistive-capacitive element 902 of the fifth embodiment, the frequency frc determined by the time constants of the resistive element 903 and the capacitive element 904 must be higher than the variation frequency fac of the voltage bias circuit 202. For example, when a rectangular wave voltage is used in the voltage bias circuit 202, the frequency frc is preferably at least several times higher than the frequency fac.

Eighth Embodiment

In an eighth embodiment, an imaging device (an image acquisition device) using an oscillator will be described. The imaging device according to this embodiment will be described using FIGS. 13A and 13B. The imaging device includes a light 801, a terahertz imaging element 802, and a timing generation unit 803.

Figure 13A:
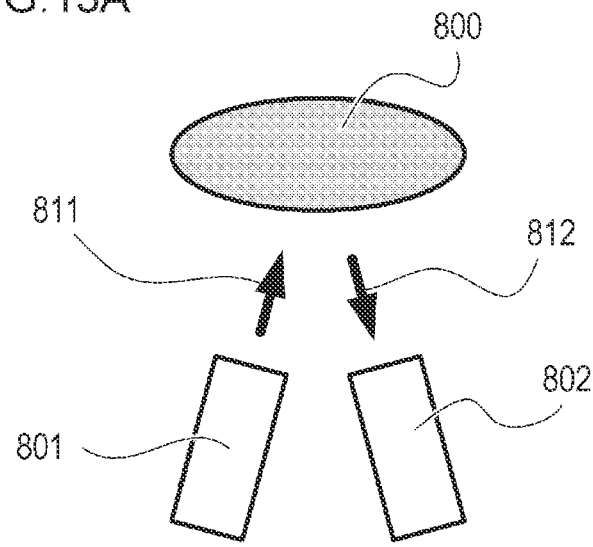
FIGS. 13A and 13B are views illustrating an imaging device according to an eighth embodiment.

The light 801 is a lighting device that includes the oscillator 1 according to the first embodiment in order to emit terahertz waves 811 (predetermined electromagnetic waves) onto an object 800. As shown in FIG. 13A, the terahertz waves 811 emitted from the light 801 are reflected by the object 800 serving as an imaging object, whereupon reflected terahertz waves 812 are captured by the terahertz imaging element 802. The image that can be obtained by the terahertz imaging element 802 varies according to the shape and physical property values of the object 800, and therefore the imaging device can obtain information about the object 800 appropriately.

According to this embodiment, in a configuration in which a plurality of oscillation circuits are driven by the same voltage bias circuit, the respective oscillation circuits can be caused to oscillate with stability at a desired frequency, and as a result, a light that outputs terahertz waves with greater stability can be realized.

Figure 13B:
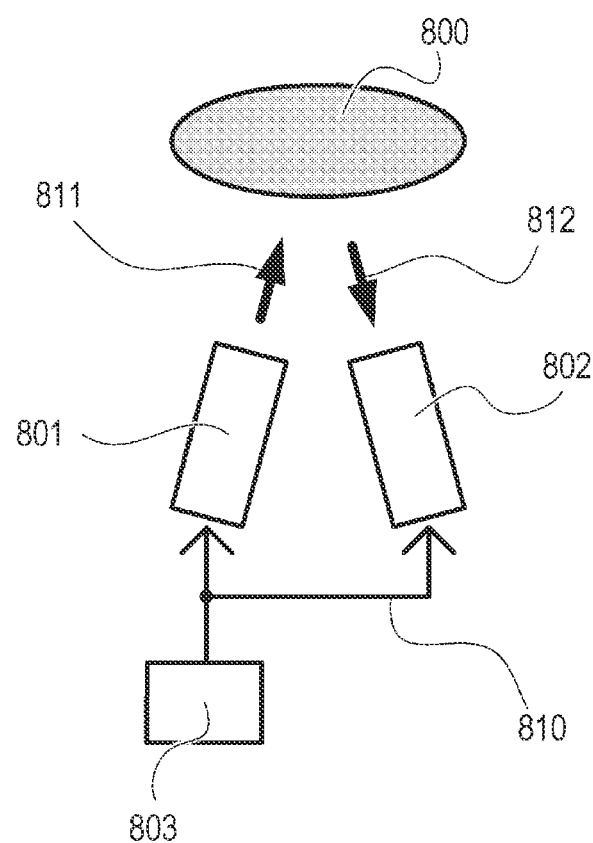

Further, as shown in FIG. 13B, the oscillator 7 according to the seventh embodiment, which uses the voltage bias circuit 202, may be used as the light 801.

In FIG. 13B, the imaging device further includes the timing generation unit 803. The timing generation unit 803 outputs a timing signal 810 to the light 801 and the terahertz imaging element 802. The timing signal 810 input into the light 801 is used to adjust the voltage variation timing of the voltage bias circuit 202. By repeating terahertz wave oscillation and stoppage periodically at the adjusted timing, the light 801 generates periods in which terahertz waves are emitted and periods in which terahertz waves are not emitted. Meanwhile, the timing signal 810 input into the terahertz imaging element 802 instigates an operation for capturing an image in the period in which the light 801 emits terahertz waves and capturing an image in the period in which the light 801 does not emit terahertz waves, and acquiring the difference between the images captured in the respective periods. Thus, unintentionally emitted terahertz wave components (which form offset noise components) can be removed. As a result, the SN ratio (Signal to Noise Ratio) of the acquired images can be improved.

When the terahertz wave oscillation circuit according to this embodiment is used in the light 801, in a configuration in which a plurality of oscillation circuits are driven by the same voltage bias circuit, the respective oscillation circuits can be caused to oscillate with stability at a desired frequency. Therefore, even when emission and stoppage are performed repeatedly, a light with a large, stable terahertz output can be obtained, and as a result, images with a high SN ratio can be acquired during use of the light in an image acquisition device.

According to this technology, oscillation can be performed appropriately in an oscillator that applies voltages to a plurality of resonators using a voltage bias circuit.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-153699, filed on Aug. 26, 2019, which is hereby incorporated by reference herein in its entirety.

What is claimed is:

1. An oscillator comprising:
   (i) a chip having a plurality of oscillation circuits, the chip being disposed on a board, the plurality of oscillation circuits configured to generate electromagnetic waves of a frequency included in a range of 30 GHz to THz,
   (ii) a voltage bias circuit configured to apply voltages to the plurality of oscillation circuits, the voltage bias circuit being disposed on the board, and
   (iii) an inductor disposed between paths connecting the voltage bias circuit and the chip, the inductor being disposed on the board.

2. The oscillator according to claim 1, wherein each of the plurality of oscillation circuits includes a negative resistance element, and
   wherein, at a predetermined frequency or higher, impedance of the inductor is higher than impedance of a negative resistance element of an oscillation circuit, among the plurality of oscillation circuits, that corresponds to the inductor.

3. The oscillator according to claim 2, wherein the predetermined frequency is a frequency of at least 10 KHz.

4. The oscillator according to claim 1, wherein the inductor is a surface-mounted element.

5. The oscillator according to claim 1, wherein the inductor has a loop-shaped wiring.

6. The oscillator according to claim 1 further comprising a shunt element disposed on the board.

7. The oscillator according to claim 6 wherein the shunt element is constituted by a capacitive element.

8. The oscillator according to claim 6, wherein, in the shunt element, a resistive element and a capacitive element are connected in series.

9. The oscillator according to claim 6, wherein the inductor is a first inductor and the shunt element is a first shunt element, and
   wherein the chip includes:
      a second inductor,
      a second shunt element, and
      an electrode to which a voltage from the voltage bias circuit is input.

10. The oscillator according to claim 9, wherein the plurality of oscillation circuits have a first oscillation circuit, and
    wherein the first oscillation circuit, the second shunt element, the second inductor, and the electrode are connected in this order.

11. The oscillator according to claim 10, wherein an impedance of the second inductor is less than an impedance of the first inductor.

12. The oscillator according to claim 1, wherein the voltage bias circuit applies AC voltages to the plurality of oscillation circuits.

13. The oscillator according to claim 1, wherein each of the plurality of the oscillation circuits includes a negative resistance element, and
    wherein the negative resistance element is a resonant tunneling diode.

14. The oscillator according to claim 1, wherein a size of the chip is between several square millimeters and several tens of square millimeters.

15. A device comprising:
    an oscillator device including the oscillator according to claim 1; and
    a detecting device for detecting an object that has been irradiated with electromagnetic waves generated by the oscillator.

16. The oscillator according to claim 1, wherein each of the plurality of oscillation circuits includes a capacitor, an inductor, and an element having a negative resistance component, as an equivalent circuit, and
    wherein the capacitor, the inductor, and the element having the negative resistance component are connected in parallel to each other.

17. An oscillator comprising:
    an oscillation circuit configured to generate electromagnetic waves of a frequency included in a range of 30 GHz to 30 THz;
    an antenna connected to the oscillation circuit;
    a first wiring connected to the antenna;
    an inductor connected to the first wiring;
    a second wiring connected to the inductor; and
    an electrode connected to the second wiring and for supplying a voltage to the oscillation circuit.

18. The oscillator according to claim 17, wherein the oscillation circuit is a first oscillation circuit, the inductor is a first inductor, the electrode is a first electrode, and the voltage is a first voltage, and
    wherein the oscillator further comprises:
       a second oscillation circuit,
       a third wiring connected to the second oscillation circuit, a second inductor connected to the third wiring, a fourth wiring connected to the second inductor, and a second electrode connected to the fourth wiring and for supplying a second voltage to the second oscillation circuit.

19. The oscillator according to claim 18, further comprising:

a third oscillation circuit, a fifth wiring connected to the third oscillation circuit, a third inductor connected to the fifth wiring, a sixth wiring connected to the third inductor, and a third electrode connected to the sixth wiring and for supplying a third voltage to the third oscillation circuit.

20. The oscillator according to claim 17, wherein the electrode is a first electrode and the voltage is a first voltage, and wherein the oscillator further comprises a second electrode for supplying a second, voltage, which is different from the first voltage, to the oscillation circuit.

21. The oscillator according to claim 20, wherein the oscillation circuit is disposed on a board, and the second voltage is supplied to the board via the second electrode.

22. The oscillator according to claim 17, further comprising a board, wherein the oscillation circuit, the antenna, the first wiring, the inductor, the second wiring, and the electrode are disposed on the board.

23. The oscillator according to claim 22, wherein a size of the board is between several square millimeters and several tens of square millimeters.

24. The oscillator according to claim 17, further comprising a shunt element which is disposed in parallel with the oscillation circuit and includes at least a capacitive element.

25. The oscillator according to claim 24, wherein, in the shunt element, a resistive element and the capacitive element are connected in series.

26. The oscillator according to claim 17, further comprising a voltage bias circuit that applies AC voltages to the oscillation circuit.

27. The oscillator according to claim 17, further comprising a negative resistance element that is a resonant tunneling diode.

28. A device comprising:

an oscillator device including the oscillator according to claim 17; and a detecting device for detecting an object that has been irradiated with electromagnetic waves generated by the oscillator.

* * * * *